United States Patent
Fung et al.

(10) Patent No.: US 11,352,855 B2
(45) Date of Patent: Jun. 7, 2022

(54) MODELING RESERVOIR FLOW AND TRANSPORT PROCESSES IN RESERVOIR SIMULATION

(71) Applicant: Saudi Arabian Oil Company, Dhahran (SA)

(72) Inventors: Larry Siu-Kuen Fung, Dhahran (SA); Xiang Yang Ding, Dhahran (SA); Ali H. Dogru, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 313 days.

(21) Appl. No.: 16/824,989

(22) Filed: Mar. 20, 2020

(65) Prior Publication Data

US 2020/0217176 A1 Jul. 9, 2020

Related U.S. Application Data

(62) Division of application No. 14/215,766, filed on Mar. 17, 2014, now Pat. No. 10,808,501.

(51) Int. Cl.
*E21B 41/00* (2006.01)
*G01V 99/00* (2009.01)
*G06T 17/20* (2006.01)

(52) U.S. Cl.
CPC ............ *E21B 41/00* (2013.01); *G01V 99/005* (2013.01); *E21B 2200/20* (2020.05); *G01V 99/00* (2013.01);
(Continued)

(58) Field of Classification Search
CPC ... E21B 41/00; E21B 2200/20; G01V 99/005; G01V 99/00; G01V 2210/642;
(Continued)

(56) References Cited

U.S. PATENT DOCUMENTS 5,740,342 A 4/1998 Kocberber
5,850,560 A 12/1998 Kang
(Continued)

FOREIGN PATENT DOCUMENTS

CA 2803144 A1 12/2011
WO 2008150325 A1 12/2008
(Continued)

OTHER PUBLICATIONS

Merland, R., et al. "Building PEBI Grids Conforming to 3D Geological Features using Centroidal Voronoi Tessellations" IAMG (2011) (Year: 2011).*

(Continued)

*Primary Examiner* — Jay Hann
(74) *Attorney, Agent, or Firm* — Bracewell LLP; Constance G. Rhebergen; Christopher L. Drymalla

(57) ABSTRACT

Orthogonal unstructured grids are automatically constructed for a field or reservoir model with two types of internal boundaries: complex wells and faults, or other discontinuities. The methodology is used to constructed simulation grids for reservoirs or fields which contains both complex fault planes and multi-lateral wells. A hierarchical grid point generation, prioritization, conflict point removal system is provided enabling the use of unconstrained Delaunay triangulation. High-quality orthogonal unstructured grids are produced with good convergence properties for reservoir simulation.

30 Claims, 19 Drawing Sheets

(52) U.S. Cl.
CPC .... *G01V 2210/642* (2013.01); *G01V 2210/66* (2013.01); *G06T 17/20* (2013.01)
(58) Field of Classification Search
CPC ..... G01V 2210/66; G06T 17/20; G06T 17/05; G06F 30/23; G06Q 50/02
See application file for complete search history.

(56) References Cited

U.S. PATENT DOCUMENTS

| | | | |
|---|---|---|---|
| 6,018,497 | A | 1/2000 | Gunasekera |
| 6,078,869 | A | 6/2000 | Gunasekera |
| 6,106,561 | A | 8/2000 | Farmer |
| 6,907,392 | B2 | 6/2005 | Bennis |
| 7,047,165 | B2 | 5/2006 | Balaven et al. |
| 7,277,836 | B2 | 10/2007 | Netemeyer et al. |
| 7,451,066 | B2 | 11/2008 | Edwards et al. |
| 7,634,395 | B2 | 12/2009 | Flandrin |
| 7,809,537 | B2 | 10/2010 | Hemanthkumar et al. |
| 7,932,904 | B2 | 4/2011 | Branets et al. |
| 8,212,814 | B2 | 7/2012 | Branets et al. |
| 8,214,187 | B2 | 7/2012 | Mouton et al. |
| 8,301,429 | B2 | 10/2012 | Hajibeygi et al. |
| 8,386,227 | B2 | 2/2013 | Fung et al. |
| 8,433,551 | B2 | 4/2013 | Fung et al. |
| 8,463,586 | B2 | 6/2013 | Mezghani et al. |
| 9,922,142 | B2 * | 3/2018 | Dachang ............... G01V 11/00 |
| 2001/0006387 | A1 | 7/2001 | Bennis et al. |
| 2002/0038201 | A1 | 3/2002 | Balaven et al. |
| 2006/0235666 | A1 | 10/2006 | Assa et al. |
| 2007/0073527 | A1 | 3/2007 | Flandrin et al. |
| 2010/0094597 | A1 | 4/2010 | Blain et al. |
| 2010/0128041 | A1 | 5/2010 | Branets et al. |
| 2010/0217574 | A1 | 8/2010 | Usadi et al. |
| 2011/0169838 | A1 * | 7/2011 | Branets .................. G06T 17/20 345/441 |
| 2011/0313745 | A1 * | 12/2011 | Mezghani ............. G01V 99/00 703/10 |
| 2012/0059639 | A1 | 3/2012 | Fung et al. |
| 2012/0179436 | A1 | 7/2012 | Fung |
| 2012/0232859 | A1 | 9/2012 | Pomerantz et al. |
| 2013/0096889 | A1 | 4/2013 | Khvoenkova et al. |
| 2014/0236559 | A1 | 8/2014 | Fung et al. |
| 2015/0260016 | A1 | 9/2015 | Fung et al. |
| 2015/0260017 | A1 | 9/2015 | Ding |

FOREIGN PATENT DOCUMENTS

| | | |
|---|---|---|
| WO | 2011163166 A2 | 12/2011 |
| WO | 2012033650 A2 | 3/2012 |
| WO | 2012033693 A2 | 3/2012 |
| WO | 2014126959 A2 | 8/2014 |

OTHER PUBLICATIONS

Answers.com; "computation" available as of May 13, 2019 at: https://web.archive.org/web/20050428134808/http://www.answers.com/topic/computation; pp. 1-6.
Branets, Larisa V. et al.; "Challenges and Technologies in Reservoir Modeling" Communications in Computational Physics, Jul. 2009, vol. 6, No. 1, pp. 1-23.
Coats, K.H. "Reservoir Simulation" Petroleum Engineering Handbook, Chapter 48, 1987; pp. 1-20.
Japanese Office Action dated Dec. 4, 2017 for corresponding Japanese Patent Application No. 2016-557914; pp. 1-3.
Japanese Office Action dated Nov. 8, 2017 for corresponding Japanese application No. 2016-558139; pp. 1-3.
Dictonary.com "Parallel" available as of Mar. 16, 2017 at <http://www.dictionary.com/browse/parallel>; p. 1.
Dogru, Ali H. et al.; "A Next-Generation Parallel Reservoir Simulator for Giant Reservoirs" SPE 119272, SPE Reservoir Simulation Symposium, The Woodlands, TX, Feb. 2-4, 2009; pp. 1-29.
Verma, S. et al.; "A Control vol. Scheme for Flexible Grids in Reservoir Simulation" SPE 37999, SPE Reservoir Simulation Symposium, Dallas, Texas, Jun. 8-11, 1997, pp. 215-227.
Dogru, Ali H. et al.; "New Frontiers in Large Scale Reservoir Simulation" SPE 142297, SPE Reservoir Simulation Symposium, The Woodlands, TX, Feb. 21-23, 2011; pp. 1-12.
Edwards, Michael G.; "Unstructured, control-volume distributed, full-tensor finite-volume schemes with flow based grids" Computational Geosciences, vol. 6 (2002), pp. 433-452.
English Translation of Japanese Office Action dated Dec. 4, 2017 for corresponding Japanese Patent Application No. 2016-557914; pp. 1-3.
English Translation of Japanese Office Action dated Nov. 8, 2017 for corresponding Japanese Patent Application No. 2016-558139; pp. 1-3.
Fung, Larry S. K. et al.; "An Unstructured Gridding Method for Densely-Spaced Complex Wells in Full-Field Reservoir Simulation", SPE 163648, SPE Reservoir Simulation Symposium, The Woodlands, TX, Feb. 18-20, 2013, pp. 1-13.
Fung, Larry S. K. et al.; "Distributed Unstructured Grid Infrastructure for Complex Reservoir Simulation" SPE 113906, SPE EUROPEC/EAGE Annual Conference and Exhibition, Rome, Italy, Jun. 9-12, 2008, pp. 1-9.
Fung, Larry S. K. et al.; "Using Unstructured Grids for Modeling Densely-Spaced Complex Wells in Field-Scale Reservoir Simulation" IPTC 17062, International Petroleum Technology Conference, Beijing, China, Mar. 26-28, 2013, pp. 1-14.
Google; "define computational" available as of May 9, 2019 at: https://www.google.com/search?q=define+computational&riz=1C1GCEU_enUS820US820&oq=define+aqs=chrome; pp. 1-2.
Heinemann et al.; "Gridding Techniques in Reservoir Simulation" XP-002741071; Proc. First Intl. Forum on Reservoir Simulation, Alpbach, 1988, pp. 339-425.
Heinemann, Z. E. et al.; "Modeling Heavily Faulted Reservoirs" SPE 48998, SPE Annual Technical Conference and Exhibition, New Orleans, LA, Sep. 27-30, 1998, pp. 1-11.
International Search Report and Written Opinion for PCT/US2014/015935 dated Jul. 1, 2015; pp. 1-14.
International Search Report and Written Opinion for PCT/US2015/020677 dated Jan. 26, 2016; pp. 1-16.
International Search Report and Written Opinion for PCT/US2015/020690 dated Jul. 15, 2015; pp. 1-12.
Karimi-Fard, M. et al.; "An Expanded Well Model for Accurate Simulation of Well-Reservoir Interaction" SPE 141675, SPE Reservoir Simulation Symposium, The Woodlands, TX, Feb. 21-23, 2011; pp. 1-12.
Katzmayr et al.; "An Iterative Algorithm for Generating Constrained Voronoi Grids" SPE 118942, SPE Reservoir Simulation Symposium, The Woodlands, Texas, Feb. 2-4, 2009, pp. 1-11.
Matijevic et al.; "Modeling Faults in Reservoir Simulation" 4th European Conference on the Mathematics of Oil Recovery, Roros, Norway, Jun. 7-10, 1994, pp. 1-16.
Mlacnik et al.; "Sequentially Adapted Flow-Based PEBI Grids for Reservoir Simulation" SPE 90009, SPE Annual Technical Conference and Exhibition, Houston, TX, Sep. 26-29, 2006, pp. 317-327.
Mundal, Sissel Slettemark el al.; "Simulation of anisotropic heterogeneous near-well flow using MPFA methods on flexible grids" Comput Geosci (2010) 14; pp. 509-525.
Partial International Search Report for PCT/US2014/015935 dated Feb. 25, 2015; pp. 1-6.
Partial International Search Report for PCT/US2015/020677 dated Nov. 4, 2015; pp. 1-5.
Verma, S. et al.; "A Control Volume Scheme for Flexible Grids in Reservoir Simulation" SPE 37999, SPE Reservoir Simulation Symposium, Dallas, Texas, Jun. 8-11, 1997, pp. 215-227.
Vestergaard, H. et al.; "The Application of Unstructured-Gridding Techniques for Full-Field Simulation of a Giant Carbonate Reservoir Developed With Long Horizontal Wells" IPTC 11512, SPE Reservoir Evaluation & Engineering, vol. 11, No. 6, Dec. 2008; pg.

* cited by examiner

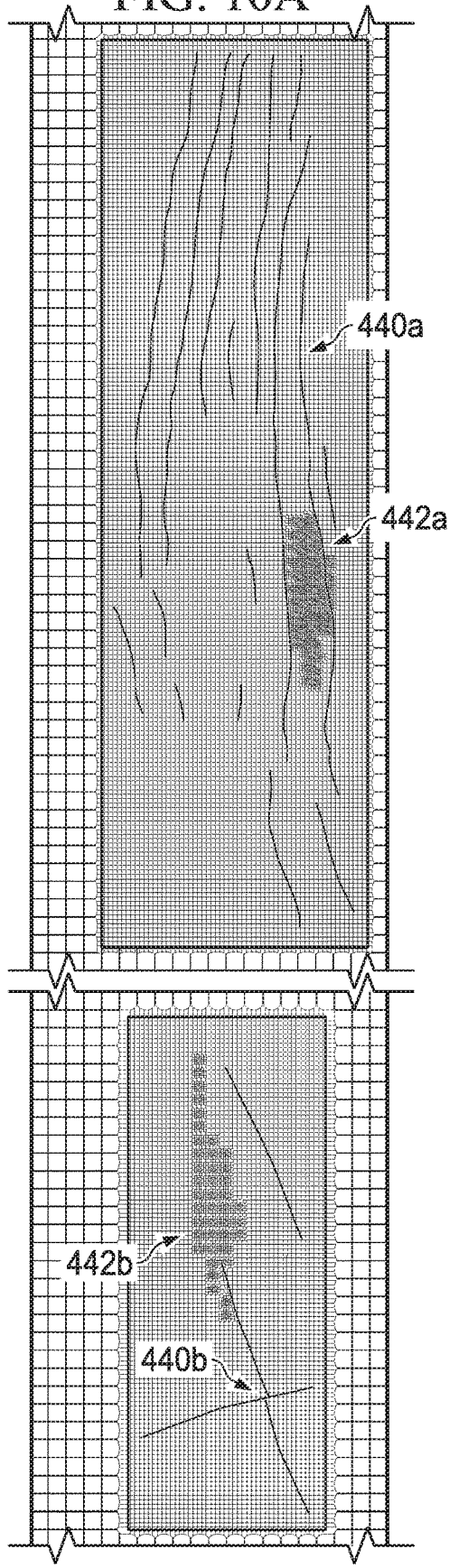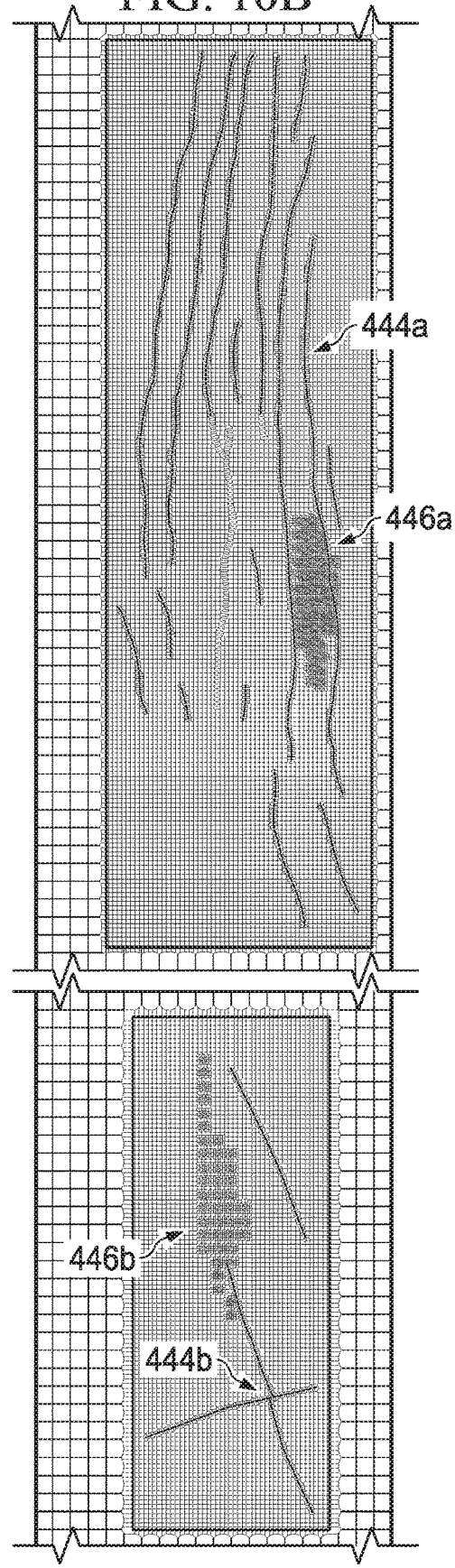

MODELING RESERVOIR FLOW AND TRANSPORT PROCESSES IN RESERVOIR SIMULATION

CROSS REFERENCE TO RELATED APPLICATIONS

The present application is a divisional application of commonly owned, U.S. Patent Application titled, "Modeling Intersecting Faults and Complex Wellbores in Reservoir Simulation" filed Mar. 17, 2014, Ser. No. 14/215,766, priority for which filing is claimed under 35 U.S.C. 120.

The present application relates to modeling for reservoir simulation, as do Applicant's prior co-pending U.S. patent application Ser. No. 14/171,815, "Systems, Methods, and Computer-Readable Media for Modeling Complex Wellbores in Field-Scale Reservoir Simulation," filed Feb. 4, 2014, based on U.S. Provisional Patent Application No. 61/766,056, "Systems, Methods, and Computer-Readable Media for Modeling Complex Wellbores in Field-Scale Reservoir Simulation," filed Feb. 18, 2013; and Applicant's companion U. S. Patent application Ser. No. 14/215,851, "Generating Unconstrained Voronoi Grids in a Domain Containing Complex Internal Boundaries", filed Mar. 17, 2014, and now U.S. Pat. No. 10,677,960, issued Jun. 9, 2020. Each of these related applications is incorporated herein by reference for all purposes.

BACKGROUND OF THE INVENTION

1. Field of the Invention

The present invention relates to modeling in reservoir simulation, and more particularly to modeling intersecting faults and complex wellbores in reservoir simulation.

2. Description of the Related Art

Reservoir simulation is the primary tool used by the oil industry for the planning and development of subterranean hydrocarbon reservoirs. With the advancement of drilling technology, wellbores which have multiple branches and complex geometries are increasingly being deployed in order to enhance production and injection processes in these reservoirs. Most reservoirs and fields have internal discontinuities such as faults, large fractures, hydraulic unit boundaries which the simulation models need to represent. At the same time, complex multi-branched wellbore are extensively being drilled to more optimally exploit these hydrocarbon resources. Existing simulation technology which uses structured grids or CPG grids cannot represent these complex internal geometry and boundaries adequately.

Applicant's related prior co-pending U.S. patent application Ser. No. 14/171,815 mentioned above relates to accurately modeling near-wellbore flow for complex wells to enhance the performance prediction for these wells. The modeling allows reservoir analysts and engineers improved data about wells and reservoirs for the decision making process to exploit the available resources.

Applied reservoir simulation uses corner-point geometry (CPG) grid to represent faults in a reservoir or domain. The CPG grid has severe difficulties in representing faults with complex intersecting geometry in portions of the reservoir grid. Use of the CPG grid can result in awkward pinching areas, and the resulting grid can be highly non-orthogonal. This in turn can lead to a necessity to use multi-point flux approximation for multiphase-flow simulation. Unfortunately, the resulting linear system can be much more difficult and/or time consuming to solve. An example of a prior-art CPG grid for representing faults is shown in FIG. 2A. Actual fault lines are shown as solid lines and approximated fault lines shown by dashed lines in FIG. 2A.

Prior art simulation has also used zig-zag boundaries of a structured Cartesian grid to represent faults. This is a very crude approximation of fault geometry. While the fault geometry representation is crude, this grid will have good numerical convergence properties. An example of zig-zag boundaries of a structured Cartesian grid is illustrated in FIG. 2B.

Unstructured gridding around internal boundaries has also been done. So far as is known, unstructured gridding for the most part has used what is known as Delaunay triangulation, with what is known as a Voronoi grid being the dual grid of the generated triangular mesh.

Traditionally, in order to preserve the internal boundary geometry, the applied Delaunay triangulation has to be constrained in order to honor internal boundary lines as the generated triangle's edge. This technique is described U.S. Pat. No. 8,212,814, "Generation of a Constrained. Voronoi Grid in a Plane", Branets et al. During the constrained Delaunay triangulation of this technique, unstructured grid points have to be adjusted, repositioned or removed, or new grid points have to be inserted explicitly near the internal boundary in order to satisfy the constraint criteria to have the generated near-internal-boundary triangles have edges on the internal boundary. Such a grid point adjustment procedure is called grid smoothing. It is usually computationally expensive, especially for large simulation models. Additionally, it leads to congested grid regions in order to satisfy boundaries but at the cost of lessened discretization, and less satisfactory convergence for reservoir simulation.

In the prior art, in the near intersection area, the grid points from each of the internal boundaries were kept during Delaunay triangulation which in turn could create many bad shaped triangles with small angles. This is discussed in "*Modeling Heavily Faulted Reservoirs*," SPE paper 48998, SPE Annual Technical Conference and Exhibition, New Orleans, La., USA, Sep. 27-30, 1998, Heinemann, et al. As a consequence, such undesired triangles increased modeling complexity and introduced numerical errors which eventually led to poor discretization and poor computational efficiency during flow simulation.

SUMMARY OF THE INVENTION

Briefly, the present invention provides a new and improved computer implemented method of generating an unstructured grid of a model of a subsurface reservoir based on input data defining internal boundary geometry and internal boundary descriptions of the reservoir model, and on well trajectory and completion data for wells in the reservoir model. The internal boundary geometry data are refined to produce grid cell points for the grid. Internal boundary lines are built connecting adjacent grid cell points to form boundary line segments, and internal boundary intersected circles are constructed at the grid cell points. Internal boundary grid points are constructed between intersections of internal boundary intersected circles of adjacent grid cell points. The generated internal boundary grid points are prioritized. Well points in the reservoir model generated, and the generated well points prioritized. Conflicting grid points between the generated internal boundary grid points and the generated well grid points are resolved. Unconstrained Delaunay triangulation on the resolved grid points performing, and a perpendicular bisection grid of the resolved grid points formed to form a Voronoi grid of data for the reservoir cells. An unstructured grid data description for the Voronoi grid is then formed.

The present invention also provides a new and improved data processing system for generating an unstructured grid of a model of a subsurface reservoir based on input data defining internal boundary geometry and internal boundary descriptions of the reservoir model, and on well trajectory and completion data for wells in the reservoir model. The data processing system includes a processor which refines the internal boundary geometry data to produce grid cell points for the grid, and builds internal boundary lines connecting adjacent grid cell points to form boundary line segments. The processor constructs internal boundary intersected circles at the grid cell points, and generates internal boundary grid points between intersections of internal boundary intersected circles of adjacent grid cell points. The processor prioritizes the generated internal boundary grid points. The processor also generates well points in the reservoir model, and prioritizes the generated well points. The processor then resolves conflicting grid points between the generated internal boundary grid points and the generated well grid points. The processor performs unconstrained Delaunay triangulation on the resolved grid points, and forms a perpendicular bisection grid of the resolved grid points to form a Voronoi grid of data for the reservoir cells. The processor then forms an unstructured grid data description for the Voronoi grid.

The present invention also provides a new and improved data storage device having stored in a non-transitory computer readable medium computer operable instructions for causing a data processing system to generate an unstructured grid of a model of a subsurface reservoir based on input data defining internal boundary geometry and internal boundary descriptions of the reservoir model, and on well trajectory and completion data for wells in the reservoir model. The instructions stored in the data storage device causing the data processing system to refine the internal boundary geometry data to produce grid cell points for the grid, and build internal boundary lines connecting adjacent grid cell points to form boundary line segments. The instructions also cause the data processing system to construct internal boundary intersected circles at the grid cell points, generate internal boundary grid points between intersections of internal boundary intersected circles of adjacent grid cell points, and prioritize the generated internal boundary grid points. The instructions also cause the data processing system to generate well points in the reservoir model, and to prioritize the generated well points. The instructions then cause the data processing system to resolve conflicting grid points between the generated internal boundary grid points and the generated well grid points. The instructions then cause the data processing system to perform unconstrained Delaunay triangulation on the resolved grid points, form a perpendicular bisection grid of the resolved grid points to form a Voronoi grid of data for the reservoir cells, and form an unstructured grid data description for the Voronoi grid.

The present invention further provides a new and improved computer implemented method of forming a model of flow and transport processes for a reservoir model composed of a plurality of grid cells and based on input data defining internal boundary geometry and internal boundary descriptions of the reservoir model, and based on well trajectory and completion data for well bores in the reservoir model, and on a Voronoi cell model of the reservoir. Voronoi cell column data extending in the reservoir for a grid cell and adjacent grid cells are received. The nature of connections between the grid cell and adjacent grid cells is determined, and the fluid flow and transport processes between the grid cell and the adjacent grid cells then determined.

The present invention further provides a new and improved data processing system for forming a model of flow and transport processes for a reservoir model composed of a plurality of grid cells and based on input data defining internal boundary geometry and internal boundary descriptions of the reservoir model, and based on well trajectory and completion data for well bores in the reservoir model, and on a Voronoi cell model of the reservoir. The data processing system includes a processor which receives Voronoi cell column data extending in the reservoir for a grid cell and adjacent grid cells. The processor determines the nature of connections between the grid cell and adjacent grid cells, and determines the fluid flow and transport processes between the grid cell and the adjacent grid cells.

The present invention also provides data storage device which has stored in a non-transitory computer readable medium computer operable instructions for causing a data processing system to form a model of flow and transport processes for a reservoir model composed of a plurality of grid cells and based on input data defining internal boundary geometry and internal boundary descriptions of the reservoir model, and based on well trajectory and completion data for well bores in the reservoir model, and on a Voronoi cell model of the reservoir. The instructions stored in the data storage device causing the data processing system to receive Voronoi cell column data extending in the reservoir for a grid cell and adjacent grid cells. The instructions also cause the data processing system to determine the nature of connections between the grid cell and adjacent grid cells, and determine the fluid flow and transport processes between the grid cell and the adjacent grid cells.

BRIEF DESCRIPTION OF THE DRAWINGS

FIGS. 10A and 10B are schematic diagrams illustrating examples of an unstructured-grid field model containing two reservoirs, each containing wells and faults.

DETAILED DESCRIPTION OF THE PREFERRED EMBODIMENTS

Figure 1A:
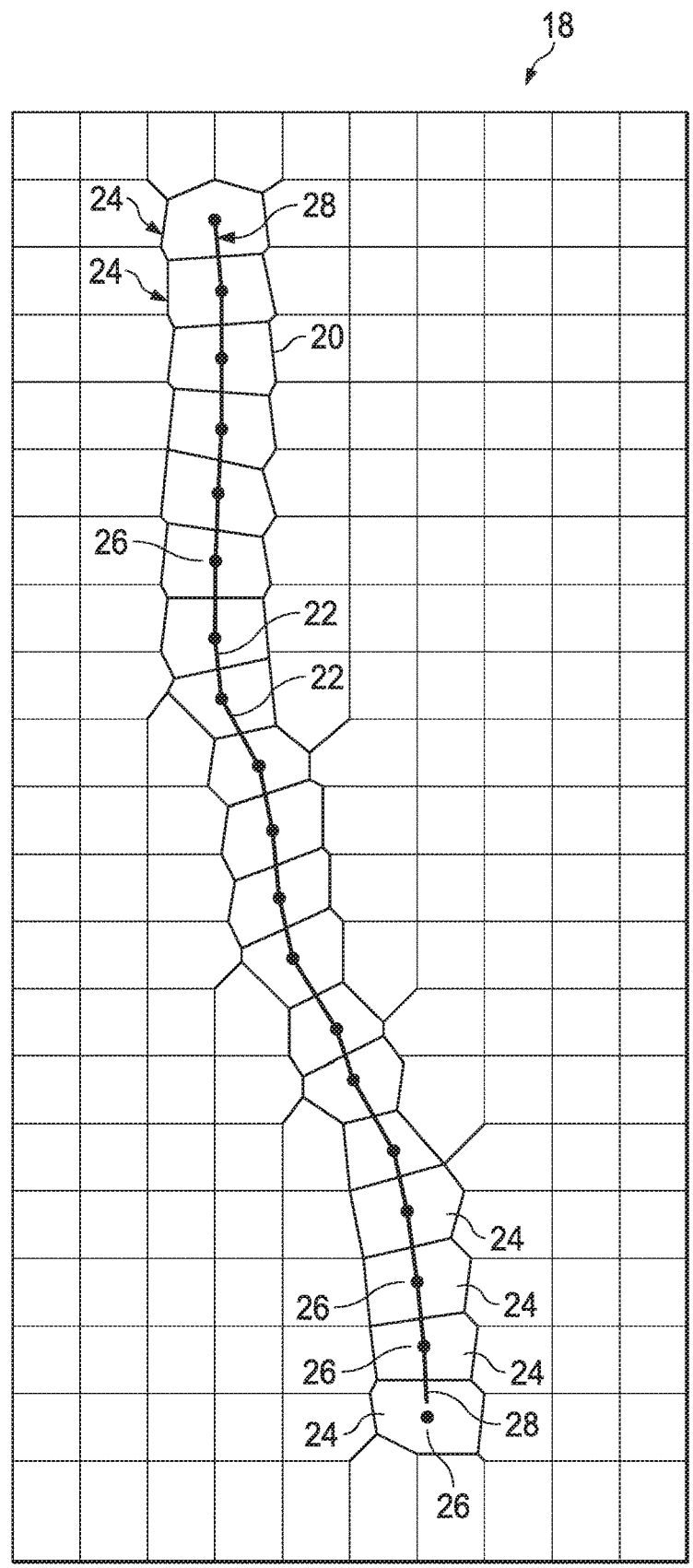
FIG. 1A is a schematic display of a type of boundary grid formed for modeling a complex wellbore using the wellbore as an internal boundary.

In the drawings, FIG. 1A illustrates a Voronoi cell diagram 18 for a boundary grid 20, in which is formed according to Applicant's related co-pending U.S. patent application Ser. No. 14/171,815, previously referenced, a model of a complex wellbore 22. According to such application, the wellbore 22 is taken as an internal boundary in the reservoir, and Voronoi cells 24 are generated by aligning cell centers 26 on the wellbore trajectory path 28. In the context of the present invention, internal boundaries according to Applicant's related co-pending U.S. Patent Application are referred to as Type 1 boundaries.

Figure 1B:
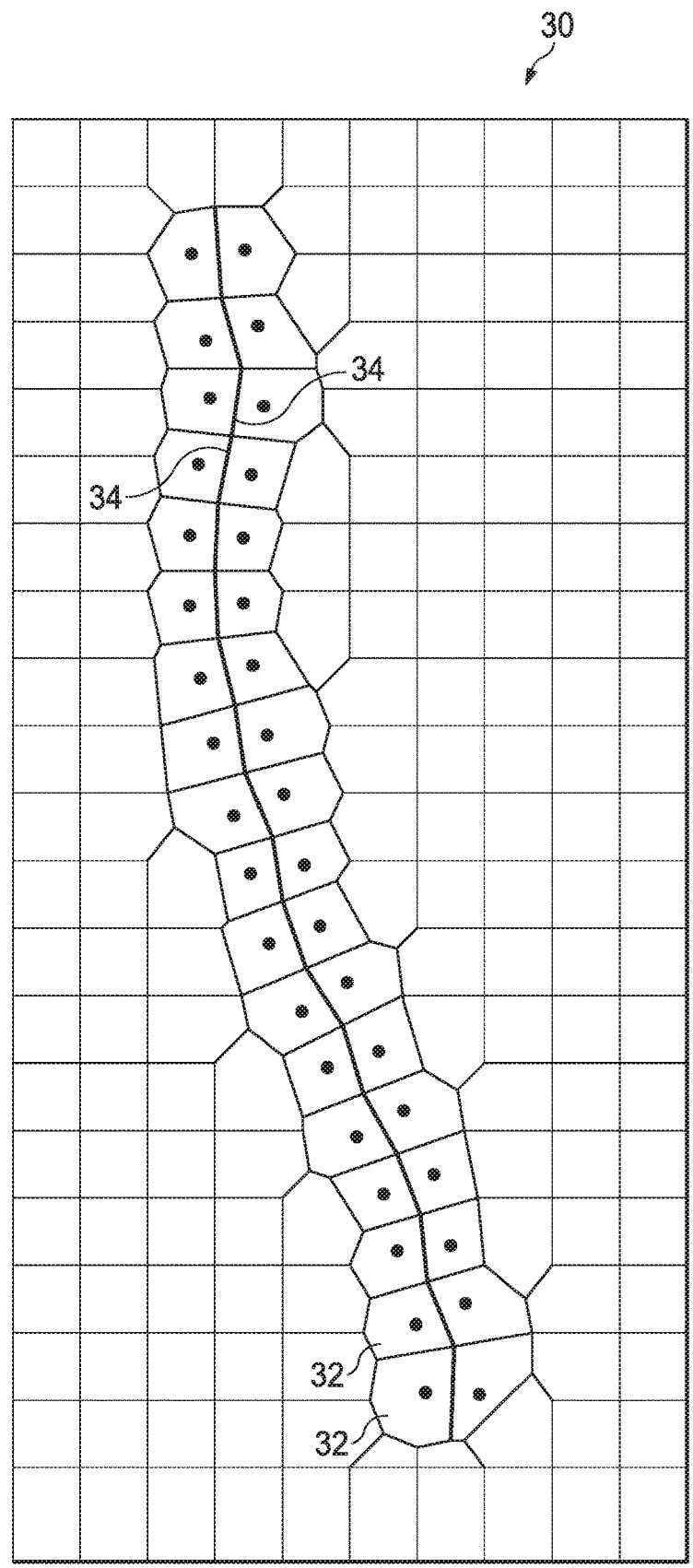
FIG. 1B is a schematic display of a type of boundary grid formed for modeling a fault plane or other discontinuity as an internal boundary.

In FIG. 1B illustrates a Voronoi cell diagram 30 for a boundary grid 32, in which is formed according to Applicant's companion U.S. patent application Ser. No. 14/215, 851, filed of even date herewith as referenced, a model of a fault line 34. According to such application, the boundary grid 30 is formed where the Voronoi cell edges align with an internal boundary. The internal boundary can be a fault plane or another type of discontinuity within the model. Other such types of discontinuities which are internal boundaries may include, for example, fractures or other forms of discontinuity in nature, such as boundaries for geological facies or hydraulic units. In the context of the present invention, internal boundaries according to Applicant's companion U.S. patent application Ser. No. 14/215,851, filed Mar. 17, 2014 are referred to as Type 2 boundaries.

Figure 1C:
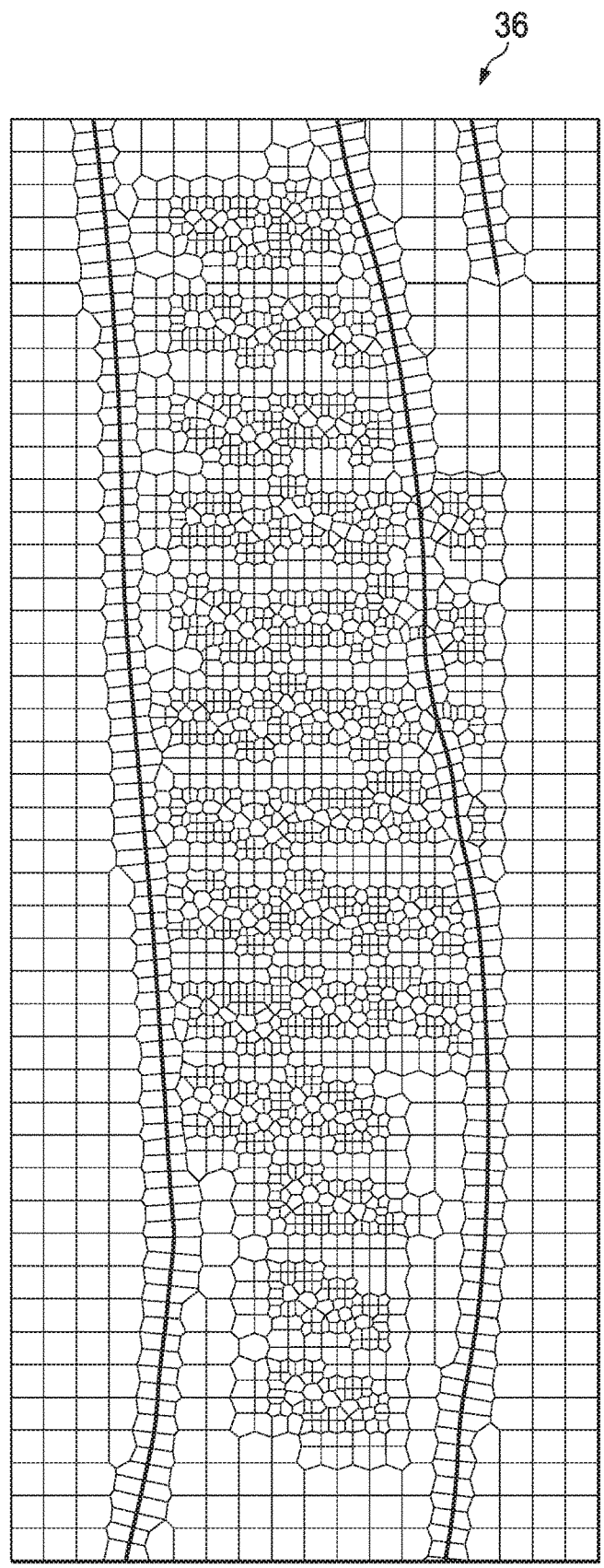
FIG. 1C is a schematic display of a type of boundary grid formed for modeling complex wellbores in a reservoir with embedded faults or other discontinuities as internal boundaries according to the present invention.
Figure 2A:
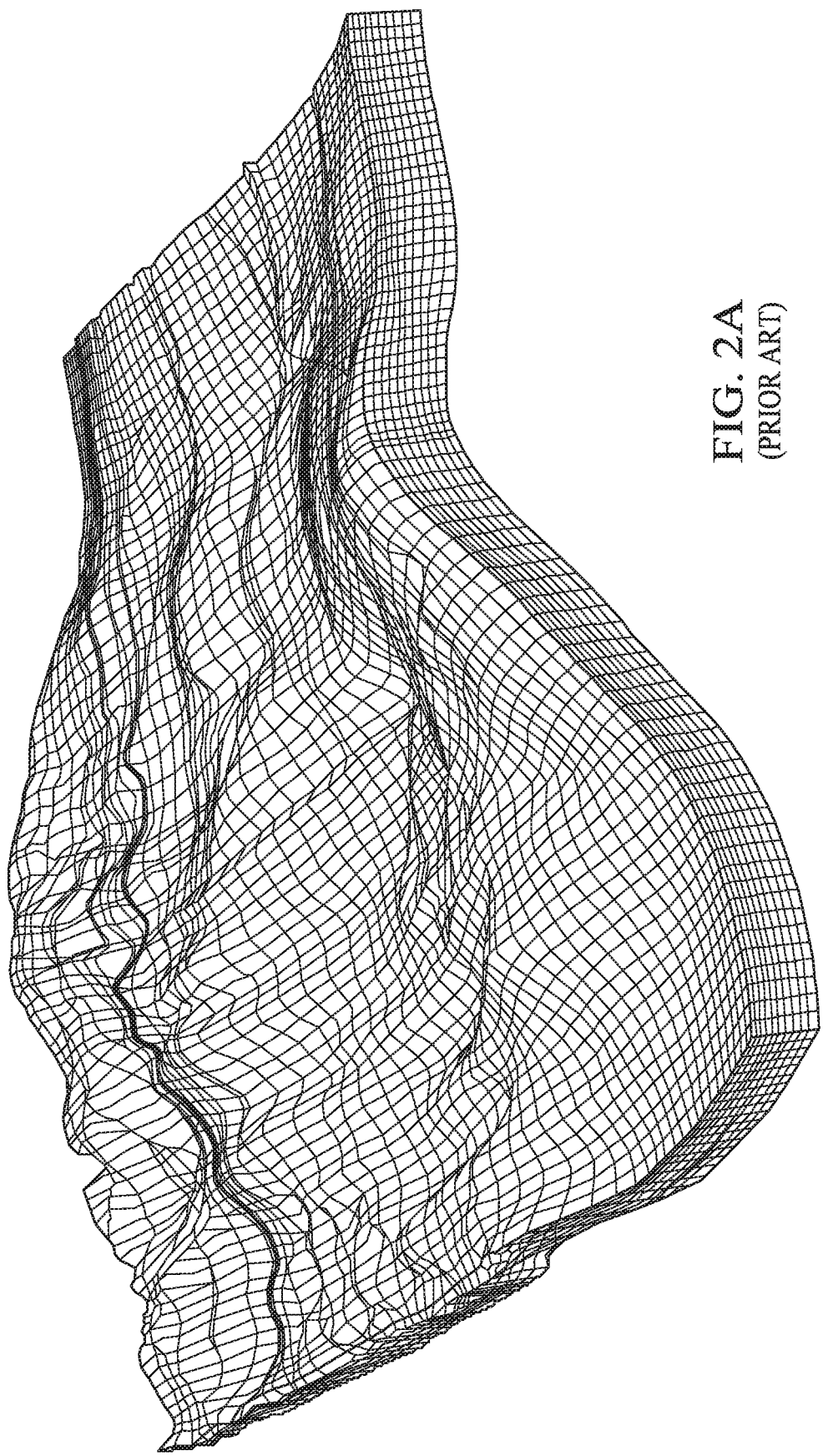
FIG. 2A is a display of a prior art corner-point-geometry or CPG boundary grid for modeling discontinuities such as faults in a reservoir.
Figure 2B:
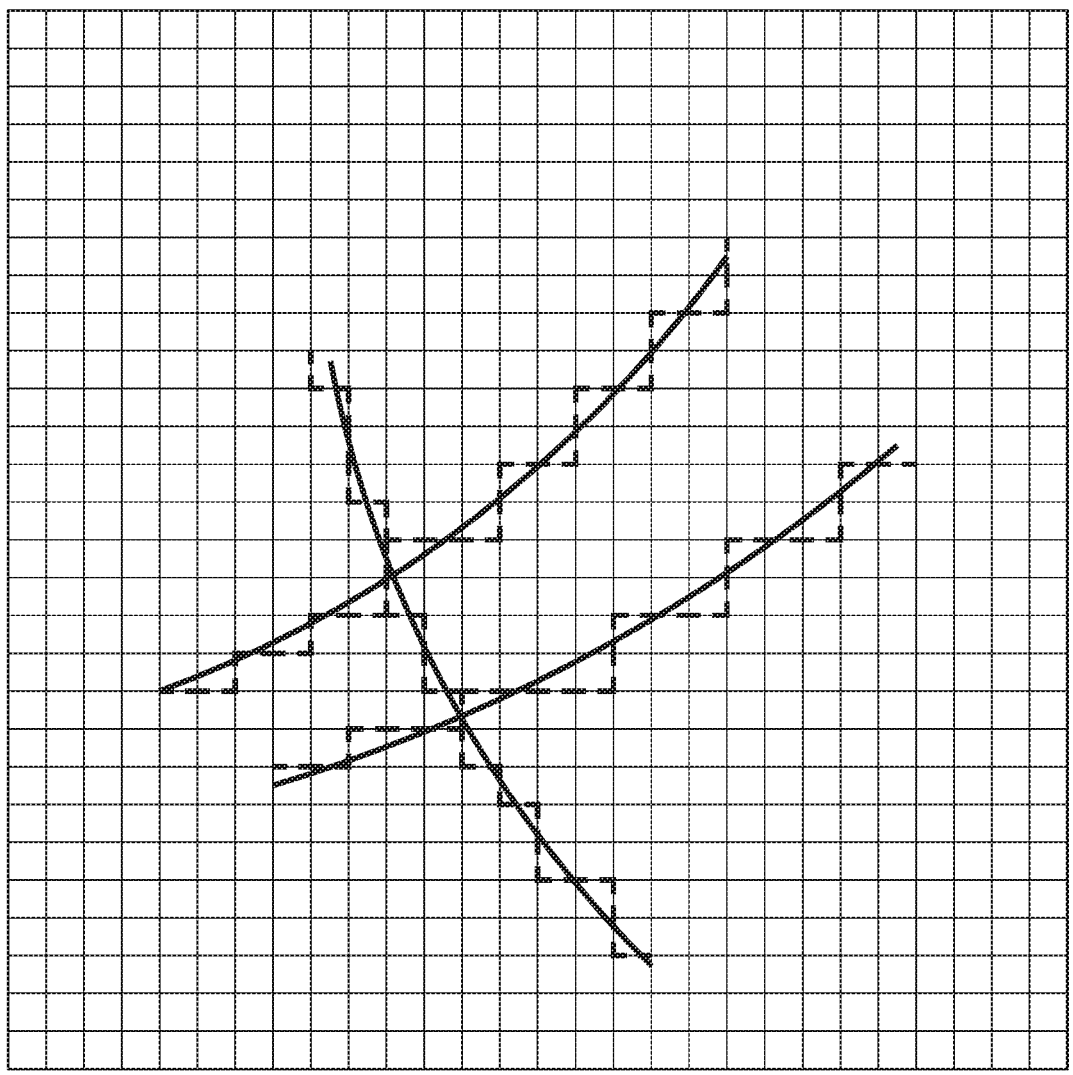
FIG. 2B is a top view display of a prior art top view of a 3D Cartesian grid model containing three fault planes.

A reservoir may have one or multiple complex irregular and intersecting internal boundaries of both Type 1 and Type 2. This situation is illustrated in Voronoi cell diagram 36 FIG. 1C. The accurate modeling of fluid flow and transport near these internal boundaries in reservoir simulation is an important consideration.

The present invention provides a methodology to construct unconstrained Voronoi grids which simultaneously satisfies the requirements for both Type 1 and Type 2 boundaries within the same model. The present invention produces a grid point set which automatically satisfies boundary constraints from both types of internal boundary. This affords the use of an unconstrained Delaunay triangulation. The resulting Voronoi grid honors internal boundaries of both type 1 and 2 automatically. There is no need for grid smoothing, additional point insertion, edge swapping, or removal of existing grid points in order to honor boundary geometry. This is advantageous over the prior art because the better grid quality and cell size translate to a more efficient and robust reservoir simulation model. Local grid congestion and bad quality grid can lead to slow runtime and poor convergence of simulation runs and has been a deterrent for using unstructured grids in practical reservoir simulation in the past.

With the present invention, a-grid points are placed and conflicts among the grid points are resolved as an a priori step for unconstrained Voronoi grid generation. The near-internal-boundary fluid flow and transport processes for both Types 1 and 2 boundaries can be correctly modeled without the complexity of grid smoothing as an expensive post processing step for the constrained Delaunay triangulation method. The conflicting boundary grid points near their intersection area are optimally merged after each of their positions is evaluated together with all the gridding criteria.

Figure 3:
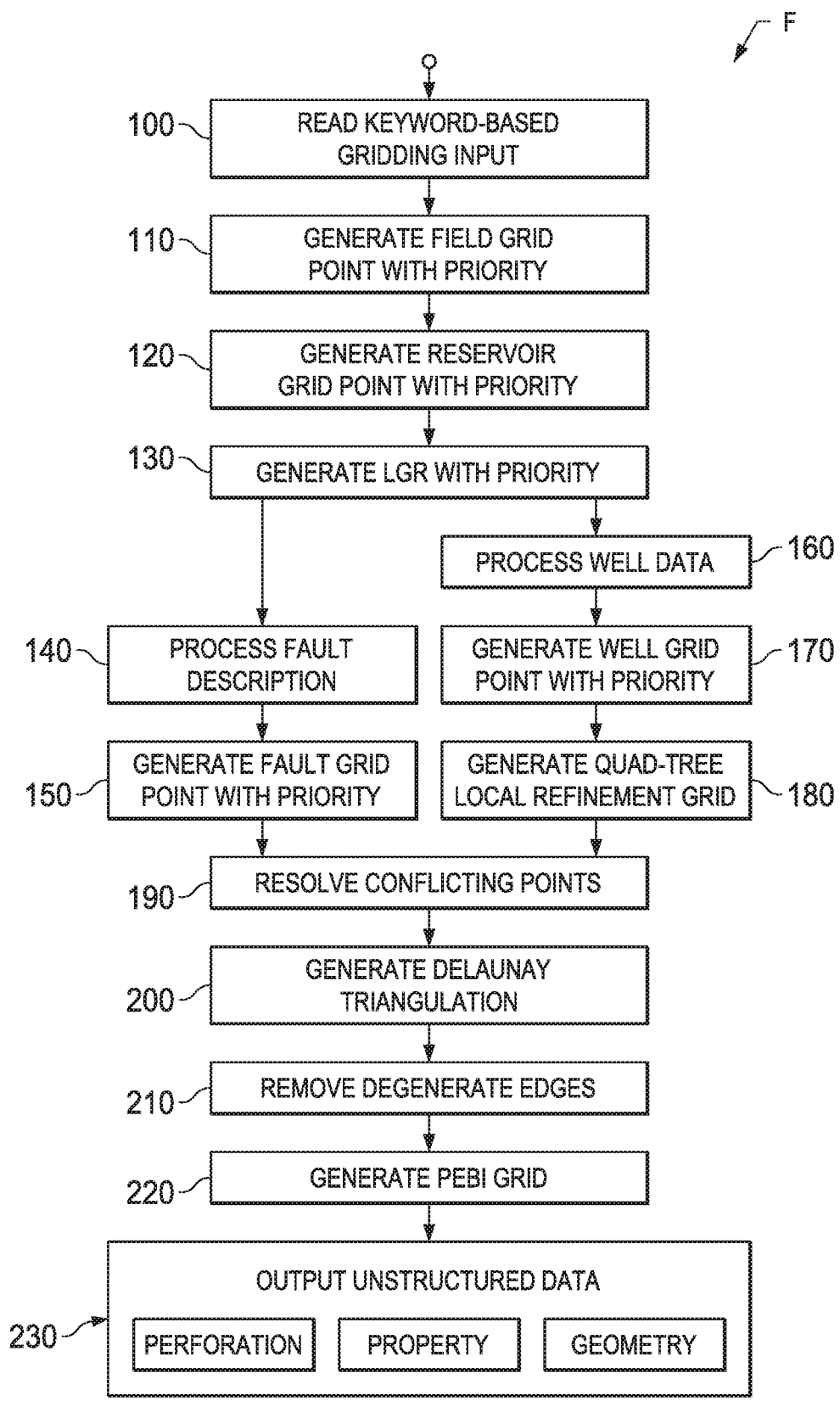
FIG. 3 is a functional block diagram of a flow chart of data processing steps for modeling intersecting faults and complex wellbores in reservoir simulation according to the present invention.

Unconstrained Voronoi Gridding Method for Domains Including Both Type-1 and Type-2 Internal Boundaries A flow chart F (FIG. 3) illustrates the basic computer processing sequence performed by a data processing system D (FIG. 16) for intersected fault and well internal-boundary unstructured gridding to perform near internal boundary unconstrained Voronoi unstructured gridding according to the present invention, and the computational methodology taking place during a typical embodiment of an internal boundary unstructured gridding according to the present invention. The procedure simultaneously satisfies both Type 1 and Type 2 internal boundaries with conflicts.

In Step 100, the keyword-based gridding input file is read into the unstructured grid builder. The gridding input file is composed of the necessary gridding specifications, such as region definitions (field region and reservoir region polygons), region grid size, fault data description, fault grid size, well data locations, geological model file and other optional input, such as future well data and local grid refinement (LGR) criterion. This step is in accordance with the related cross-referenced applications incorporated by reference above.

In Step 110 and 120, the field and reservoir grid points are constructed first based on the region polygon and grid size. The grid points are evenly distributed in the field or reservoir region with a weighed value to represent the priority. In general, the reservoir grid point distribution is finer than the grid points in the field region and has a higher priority value than the field grid point. These steps are performed according to Applicant's prior co-pending U.S. patent application Ser. No. 14/171,815 referenced above. Such a priority value is used during Step 190 to remove conflicting points, as will be discussed.

In Step 130, the LGR grid points are built if an LGR option is selected to be applied. The refined grid points in the specified local regions are created based on the refinement requirement. The refined grid points are assigned with a higher priority value than the field and reservoir grid points, so that locally refined points can be kept when the refinement grid point conflicts with field or reservoir grid points.

These steps are performed according to Applicant's prior co-pending U.S. patent application Ser. No. 14/171,815 referenced above.

Steps from Step 100 to Step 130 are preliminary steps to produce the background grid for fault and well unstructured gridding. The fault gridding is from Step 140 to Step 150 while Steps from Step 160 to Step 180 create the well grid points.

In Step 140, the fault internal boundary description is read into the unstructured grid builder. The unstructured grid builder is compatible with commercial reservoir simulation pre-processing software which builds geological models, and the internal boundary representation data created in such software, such as PETREL and GoCAD, usually outputted in corner-point-geometry CPG format, is loaded into the unstructured grid builder. This step is performed according to Applicant's related companion U.S. patent application Ser. No. 14/215,851, filed Mar. 17, 2014, entitled "Generating Unconstrained Voronoi Grids in a Domain Containing Complex Internal Boundaries-", and now issued as U. S. Patent No. 10, 677,960, dated Jun. 9, 2020.

In Step 150, fault grid points are generated side by side along the fault geometry in the manner described in Applicant's companion case U.S. patent application Ser. No. 14/215,851, which is previously referenced. The difference here is that when a well path is approached to within one space and the well point spacing is less than the fault point spacing, the fault grid point spacing step down to the well spacing. Fault point spacing is resumed after one space away from the nearest well path. If the fault line intersects a well trajectory, the nearest point is the intersection point. During Step 150, fault grid points are assigned the highest priority, with a higher priority value than the well points, the LGR points, the reservoir points, and the field grid points.

For the well grid point generation, the well trajectory and completion data are read into the unstructured gridding software in Step 160. The well grid points are then selected during Step 170 based on the wellbore location and well grid size. The well grid points are assigned a higher priority than all other points (LGR points, reservoir points, and field points) except the fault points. The well point generation is similar to Applicant's prior co-pending U.S. patent application Ser. No. 14/171,815 referenced above with one additional process. If the prescribed fault point spacing is smaller than the well point spacing, the well grid point spacing steps down to the fault line spacing; Well point spacing is resumed after one space away from the nearest fault path. If the well trajectory intersects a fault line, the nearest point is the intersection point. Otherwise, the method step is performed according to Applicant's prior co-pending U.S. patent application Ser. No. 14/171,815.

In Step 180, Multi-level quad-tree grid points are triggered when a reservoir grid point falls within user-specified distances from a well point. Each successive quad-tree level of points has higher priority than the previous level. Quad-tree points have lower priority than well grid points and fault grid points, but higher priority than all the other grid point types.

Local grid refinement are the well is optionally applied to provide further refinement near the well trajectory. The refined grid points along the two sides of the wellbore have higher priority than the quad-tree points but lower priority than well points and fault points.

Step 190 is an a priori grid point optimization step to select a set of grid points produced from the previous grid-point placement steps. From all the grid points of each category, the merging procedure takes into account the grid-point locations and assigned priority values. A conflict arises when the distance measure between two grid points is less than the required spacing for the region. In cases of conflicts, the higher priority grid points displace the lower priority points. This step is performed as described to the similar method steps in the related cross-referenced applications incorporated by reference above, with the conflict-point prioritization hierarchy including both the fault points and the well points. The resulting grid-point set is the point set for the next triangulation step. The combination of point placement and prioritization strategy results in a high-quality grid which is good for numerical reservoir simulation and at the same time honors the internal boundaries and grid spacing specified in the model.

In Step 200, unconstrained Delaunay triangulation is applied to the resulting point set. The incident grid points are kept, and no further point insertion or removal is required in this step. Next, degenerate edges are cleaned in Step 210 before the dual of the Delaunay triangulation, perpendicular bisection or PEBI grid, is created in Step 220. This step is performed according to the similar method steps in the related cross-referenced applications incorporated by reference above.

In Step 230, an unstructured grid data description is generated for the Voronoi grid. The well perforation intervals and trajectory processed in Step 160 are used to calculate perforation locations so that Voronoi cell indices and exit-entry location are determined. The static property at each of the Voronoi cells, such as porosity and permeability, are calculated. These unstructured data make up the output data set from unconstrained complex internal boundary unstructured gridding according to the present invention. This data set is complete and ready to be passed a reservoir simulator R in the data processing system D, which preferably is a parallel reservoir simulator, such as Applicant's GigaPOWERS, for performing unstructured-grid simulation.

Intersecting Fault Data Description and Fault Z-line Indexing Methodology

A 2.5D unstructured Voronoi-grid geometry data is described Applicant's prior U.S. Pat. No. 8,463,586. The additional data and method to describe complex faults and the associated parallel method to construct flow-term connection factors, also known as transmissibilities, across the fault faces are described in the following sections. Fault transmissibilities are built as an integral part of the present invention to determine transmissibility while the distributed parallel 3D unstructured graph representing connections of the grid is being built.

Within the simulated region, there can be multiple fault surfaces. They are described by a collection of Z-line pairs describing the depths to each geologic horizon on either side of the fault blocks. A fault surface may or may not intersect other fault surfaces. Multiple fault surfaces can intersect to form fault loci where multiple Z-lines overlap, but the depths to each horizon may be distinct from each other.

Figure 4A:
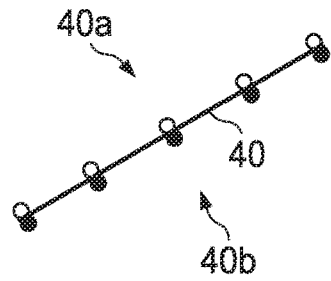
FIGS. 4A, 4B, 4C, 4D, and 4E are schematic diagrams illustrating examples of Z-line representations of fault lines formed during the data processing steps of FIG. 3.
Figure 4B:
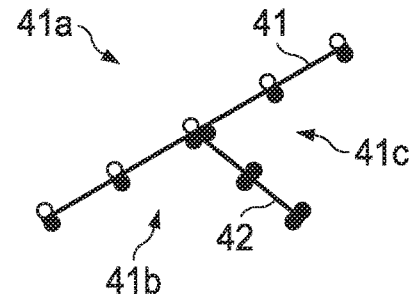
Figure 4C:
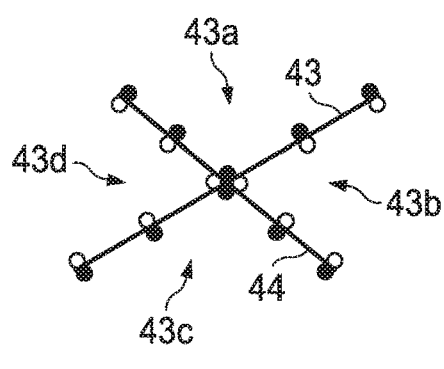
Figure 4D:
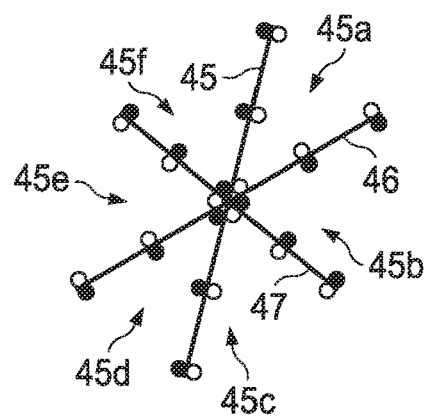
Figure 4E:
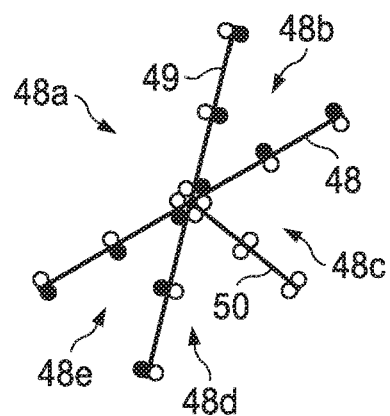

FIGS. 4A through 4E are top views which depict five examples of some fault lines and fault surfaces. FIG. 4A depicts a fault line or Z-line 40 for a fault between two fault blocks 40a and 40b. FIG. 4B depicts two fault lines 41 and 42 between three fault blocks 41a, 41b, and 41c. FIG. 4C depicts two fault lines 43 and 44 between four fault blocks 43a, 43b, 43c, and 43d. FIG. 4D depicts three fault lines 45, 46 and 47 between six fault blocks 45a, 45b, 45c, 45d, 45e, and 45f FIG. 4E depicts three fault lines 48, 49 and 50 between five fault blocks 48a, 48b, 48c, 48d, and 48e. It is to be noted that the Z-lines of FIGS. 4A through 4E can be curved lines and need not be vertical. The use of vertical Z-line as an example for the following description simplifies the examples and discussion of the organization and index referencing which relate fault Z-lines to the base Z-lines.

Figure 5:
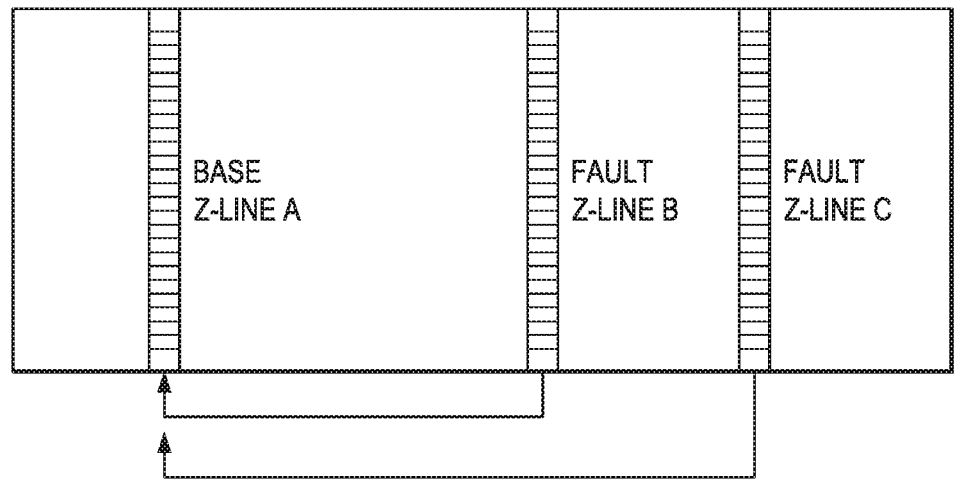
FIG. 5 is a schematic diagram illustrating z-line data and index references which relate the fault Z-lines to the base Z-lines during the data processing steps of FIG. 3.

The data organization is depicted in FIG. 5, which illustrates Z-line data and index references which relate the fault Z-lines to base Z-lines. A non-fault vertex of the Voronoi grid has only one Z-line. A fault vertex of the Voronoi grid has two or more coincident Z-lines but with different depths at each horizon intersect. The data for the Z-lines are subdivided into two sections. The leading section is for the base Z-lines, while the trailing section is for the fault Z-lines. Each Voronoi cell vertex position in a column of cells is described by a Z-line. The Z-line number in a Voronoi cell's vertex lists can be a base Z-line or a fault Z-line. An integer array known as the fault Z-line reference is stored which index the base Z-line number corresponding to this fault z-line. Each fault Z-line has a base Z-line reference. In this example, the three Z-lines at the intersection of the fault lines 1 and 2 in FIG. 4B are shown. The Z-line data contain the depths to each geologic horizon of the model. An integer array exists which stores the base Z-line index for each fault Z-line. For this example, these reference indices for the fault Z-line B to base Z-line A and the fault Z-line C to base Z-line A are indicated in FIG. 5.

Figure 6:
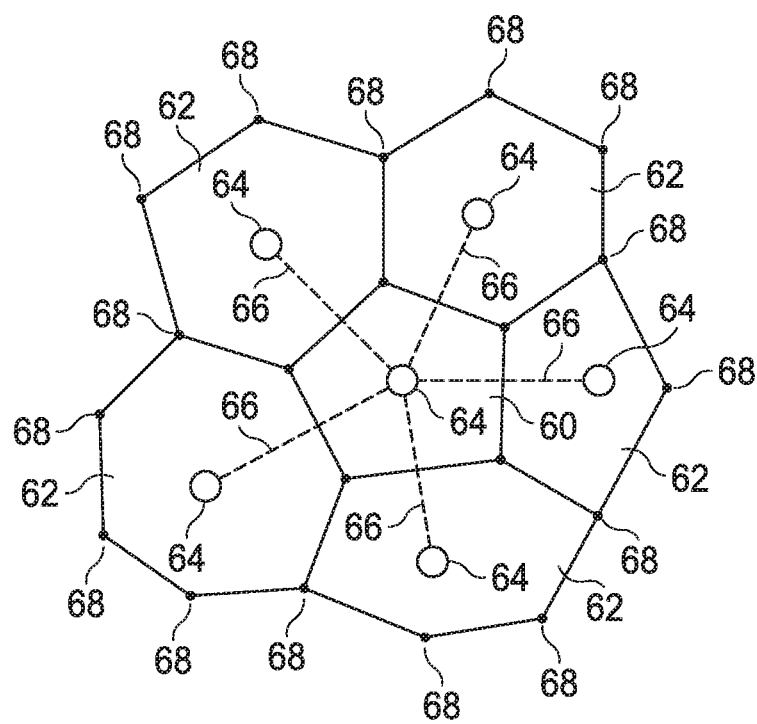
FIG. 6 is a schematic diagram showing an example Voronoi cell column and its 5 neighbor cell columns.

FIG. 6 is an example of a Voronoi cell column 60 and its five neighbor cells columns 62. The Voronoi cell centers are each indicated at 64 and Voronoi cell vertices indicated at 68. The dashed lines 66 represent schematically the local portion of the 2D interconnectivity graph.

Parallel Distributed Graph Construction Method and Calculation of Connection Factors (Transmissibilities)

In parallel computation, the simulation domain is partitioned into equal or nearly equal numbers of Voronoi cell columns. The number of partitions is equal to the number of distributed compute processes used for performing the simulation. A partition of columns of Voronoi cells may or may not contain fault planes. A compute process only needs to contain data for the columns of Voronoi cells which it owns.

In the disk files, global data is stored as a contiguous space for the entire simulation domain. This is known as global data store in disk storage. In parallel computer simulation, each compute process only needs to store the data in the random access memory (RAM) belonging to its own grid partition plus a strip of ghost cells called the halo. These data require an indexing system which allocates, for each local cell in a domain partition, where the cell is in the global data space. The local cell number is variable from one simulation run to the next for a given data set. Applicant's prior U.S. Pat. Nos. 8,386,227 and 8,433,551 discuss the data and mechanisms to achieve this.

Construction of the distributed parallel graph from the input global data, with particular reference to the additional data and method for the fault connections, and the method for fault transmissibility calculation are performed according to the present invention. The data and the fault connection method are both distributed and local.

Figure 7:
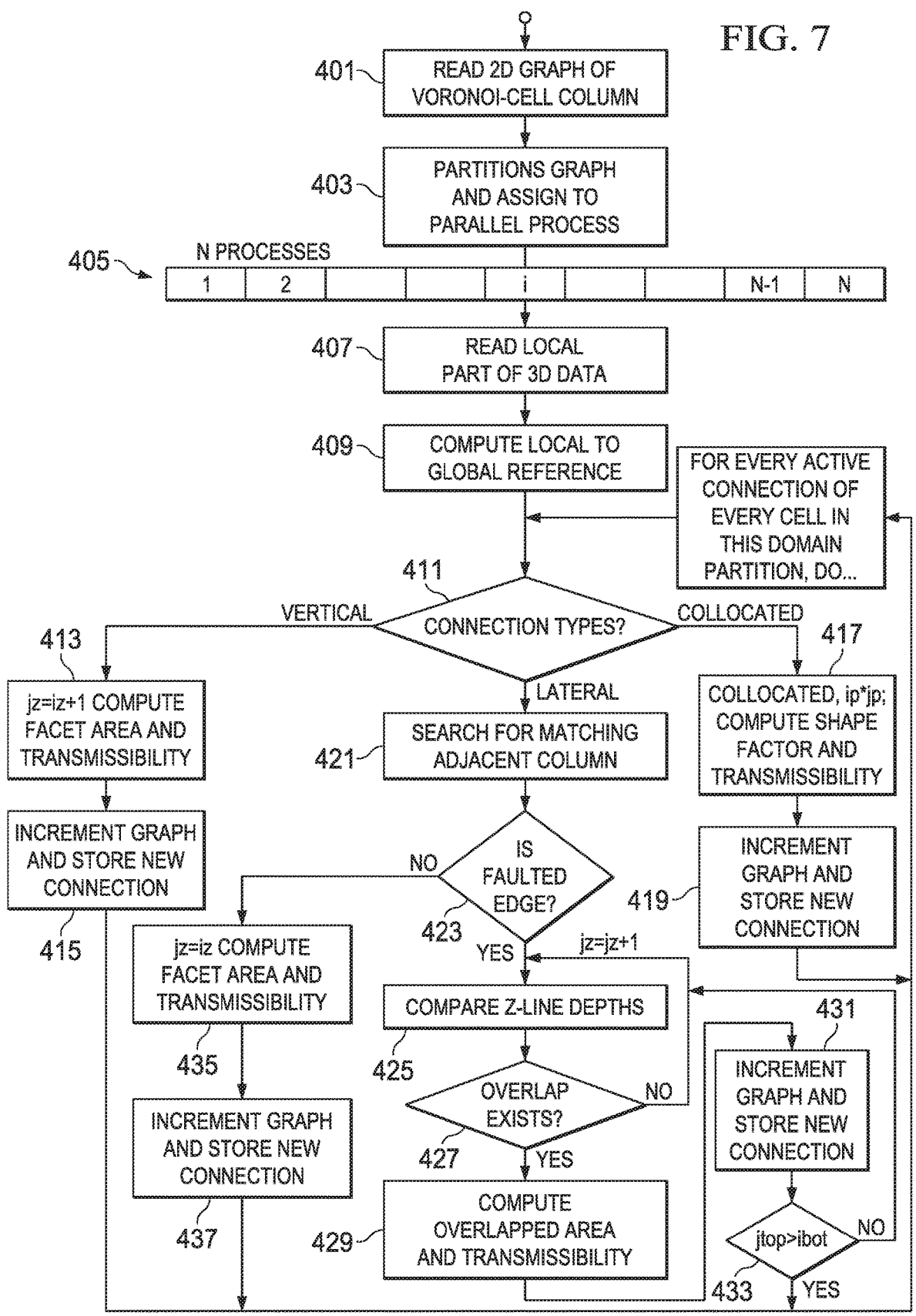
FIG. 7 is a functional block diagram of a flow chart of data processing steps for providing graph and connection factors for flow simulation according to the present invention.

A flow chart B (FIG. 7) illustrates the basic computer processing sequence performed by a data processing system D (FIG. 16) for building the parallel graph and connection factors for flow simulation according to the present invention, and the computational methodology taking place during a typical embodiment according to the present invention.

In step 401, the 2D connectivity graph of Voronoi-cell columns are read. The connectivity of a Voronoi cell column to its neighboring cells is described as bi-directional graph and stored in the compressed spare row (CSR) format. An example showing the top view of a cell column with five adjacent neighbors' cell columns is illustrated in FIG. 6 where the open dots 64 represent the cell center and the dark dots 68 represent the Z-lines positioned at the cell vertices.

In step 403, the connectivity graph is partitioned into n subdomains for Voronoi cell columns; the active cell count in a column is used as node weight in a graph partitioning. The K-way partitioning method divides the 2D graphs into N equal partitions of equal workload and minimizes edge cuts. For each Voronoi cell column, the Z-line number for each vertex is stored as a vertex list. Both the Voronoi-cell-column connectivity graph, also known as adjacency graph, and the vertex list are in local partition numbering. Data references from the local numbering to the global numbering are constructed and stored. This provides the sufficient information to populate each process i of step 405 to extract and process data elements in the global disk data store.

Step 407 is a parallel read step for each process, for example the process i, to read its own partition of data only. At this stage, the cell ordering is not yet specified. Thus, it is based on a local Z-line ordering. Step 409 constructs the local to global reference to facilitate the construction of the 3D parallel distributed graph to represent the cell-to-cell connections of each Voronoi cell for flow simulation.

With the present invention, a global data array is neither stored nor required. This is a distinct advantage for a very-large-scale simulation model which may contain billions of Voronoi cells, and where one global data array can overwhelm the available RAM on one compute node of a typical HPC cluster.

In Step 411, the local unstructured adjacency graph is used in the outer Do loop to go through the entire local connection list cell by cell. If a cell contains more than one porosity partition, it is included in the loop. Three types of connections are identified: vertical connections, lateral connections, collocated connections. For vertical connections, step 413 computes the cell face area and transmissibility, and step 415 increments the unstructured graph and store the new transmissibility value. Similarly, for collocated cells (multiple-porosity multiple-permeability), step 417 calculates the shape factor and the transmissibility and step 419 increment the graph and stores the transmissibility.

Figure 8:
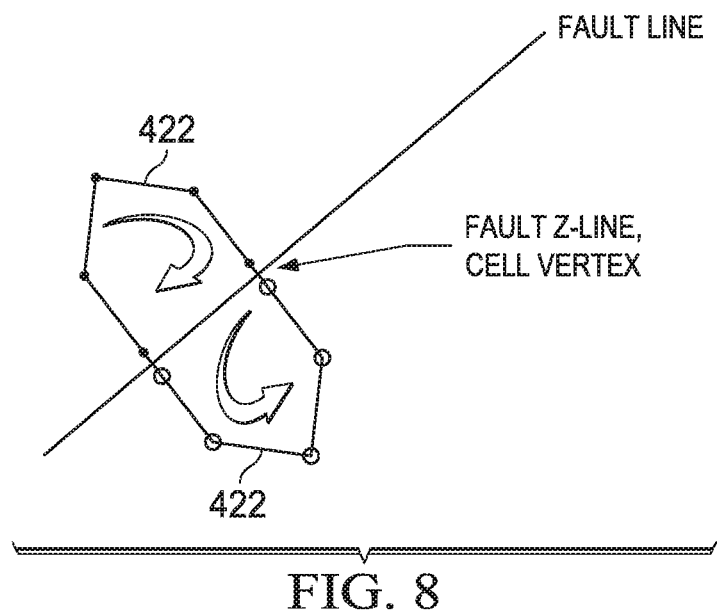
FIG. 8 is a schematic diagram showing two adjacent Voronoi cells on either side of a fault line and the vertex pair rotation directions during the data processing steps of FIG. 7.

If the connection is a lateral connection, step 421 searches for the matching neighbor Voronoi cell column. Each connection face is delineated by the z-lines coordinates and depths at two adjacent vertices of a Voronoi cell. For each cell, an inner Do loop goes over all the adjacent cells j of this cell i. Then, there is a double inner Do loops to go through the cell's vertex indices in pairs, clockwise for the cell i and anticlockwise for the neighbor cells j to locate the shared boundary between cells i and j. This is illustrated in FIG. 8. In the construction of a connected graph from the geometry data, pairs of cell vertices of each Voronoi cell 422 are cycled, clockwise in one and counter-clockwise in the other as indicated. This is done to locate the common edge on either side of the fault line. The vertex indices are the z-line indices. If the index is a fault index, the base index is referenced to find the match. This is step 423 where the fault connections are identified. The double DO loop exits when the common boundaries between this cell i and the adjacent cell j is found.

If the connection is a fault connection, step 425 is executed. For the cell, the edge, and the layer, the lateral cell face is given by the two consecutive z-line points of the two z-lines prescribing that cell edge. The cell face is a quadrilateral defined by four spatial points. For the adjacent cell edge, there is a NZ loop for the adjacent column $j_c$ which goes through all the layers of the adjacent cell column. For the adjacent cell j, the adjacent edge, and the adjacent layer, the lateral cell face is given by the two consecutive z-line points of the two z-lines prescribing that adjacent cell edge.

In step 427 and 429, the adjacent column loop goes through the adjacent cell faces to find and calculate all of the overlapping areas of this cell i with any of the adjacent cells j in the neighboring cell column. A connection factor, transmissibility, is calculated between the two cells when an overlapped area exists and the transmissibility multiplier for the fault is non-zero. The inter-cell transmissibility $T_{ij}$ between this cell i and the adjacent cell j is calculated as:

$$T_{ij} = \frac{F_{mult}}{\frac{1}{T_i} + \frac{1}{T_j}}$$

where $F_{mult}$ is the fault transmissibility multiplier and $T_i$ is the half transmissibility contribution from cell i and has the form:

$$T_i = \frac{\overline{A} \cdot \overline{d}_i}{\overline{d}_i \cdot \overline{d}_i} \overline{k}_i$$

where $\overline{A}$ is the directed overlapped area between cell i and j. $d_i$ is the directed distance from the cell center to the face center of cell i and $\overline{k}_i$ normal permeability to the cell face.

Figure 9A:
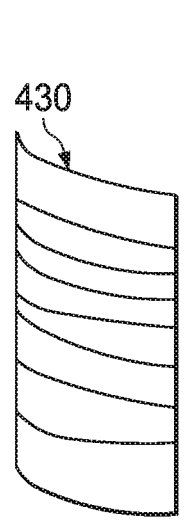
FIGS. 9A, 9B, and 9C are schematic diagrams illustrating locating of possible overlapping areas using corresponding Z-line depths during the data processing steps of FIG. 7.
Figure 9B:
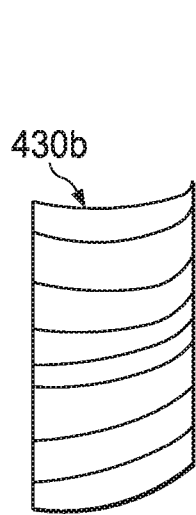
Figure 9C:
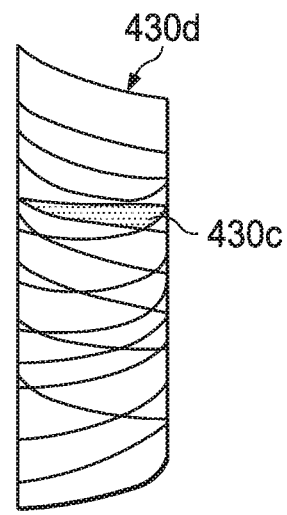

The calculation of overlapping area to form fault transmissibility is further illustrated in FIGS. 9A, 9B and 9C. Once a common edge is located for each cell on a left fault block 430 (FIG. 9A) possible overlapping areas with each cell of a right fault block 430b (FIG. 9B) are located using the corresponding z-line depths. Each cell face is described by the four corner-point co-ordinates. A fault connection 430c (FIG. 9C) is indicated in a display 430d if overlapped cell faces. Step 431 increments the connection graph and stored the computed transmissibility. Step 433 uses the depth compare of adjacent Z-line to exit the NZ loop when the adjacent column depth tops is below any column depth bottoms.

If the connection is not a fault connection, step 435 is executed, it this case, $\overline{A}$ is simply the face area of the cell for the transmissibility calculation. The fault transmissibility multiplier $F_{mult}$ is not used. The other terms have the same meanings as those stated in the formula above. Step 437 increments the connectivity graph and stores the calculated transmissibility.

For matrix solution, the cell ordering and hence the connectivity graph ordering are permuted to enhance the solution of the matrix equations. These aspects are discussed in Applicant's prior U.S. Pat. Nos. 8,386,227 and 8,433,551.

The present invention simultaneously honors two types of internal boundaries in a simulation domain. A Type 1 boundary is for wellbore trajectories that are traced by a locus of Voronoi cell centers. A Type 2 boundary is for domain discontinuities such as fault lines that are traced by edges of the Voronoi cells. Both types of boundaries can be intersecting and congested in locations of the simulation domain. Grid point density near the boundaries can be optimally controlled by user specifications.

The present invention optimally generates and prioritizes grid points, grid-point conflicts are resolved to result in an optimal point set. The optimal point set is used in an unconstrained Delaunay triangulation. The perpendicular bisection (PEBI) method is used to generate the Voronoi dual grid. The resulting discretization is orthogonal, and optimally honors the internal boundaries with the desired Voronoi grid cell density. The discretization efforts two-point-flux approximation (TPFA) in finite volume method (FVM) resulting in an accurate, efficient, high-fidelity, and numerically convergent discretization for reservoir simulation.

The gridding methodology of the present invention generates the unstructured grid for a domain (reservoir or field) containing multiple types of internal boundaries (complex wells, faults, and other discontinuities), and is a component of reservoir simulator preprocessing. The present invention is a module of the unstructured grid simulation workflow.

For an unstructured grid simulation, a specific set of unstructured data which includes the unstructured grid geometry and connectivity data, wellbore trajectory and completion geometry in the generated unstructured grid, fault information in the z-line data space is required. Applicant's U.S. Pat. No. 8,386,227 and co-pending application Ser. No. 14/171,815 previously referenced, provide portions of the information for such a set of unstructured data. The present invention provides the additional fault z-line relationship data and how that data is used to generate parallel distributed graph and to calculate inter-cell connection factors (transmissibilities) on the fault plane for doing parallel reservoir simulation.

Reservoir simulation has been successfully conducted according to the present invention and has demonstrated the improvement in results when compared against prior art method using structured grid. A case study of using a full-field simulation model known to include 2 reservoirs with 70 Type 1 and 21 Type 2 internal boundaries, some of which are intersecting, is used as an example.

Two unstructured gridding are conducted by using the same unconstrained Voronoi gridding method. However, in the first gridding as shown in FIG. 10A, a display of gridding with the present invention applied for Type 1 internal boundaries only is shown where the grid does not honor the fault lines 440a and 440b Thus the Voronoi cell edges do not conform to the type 2 boundary geometry. The grids near well groups 442a and 442b honor the Type 1 (well geometry) but not the Type 2 (fault geometry). In FIG. 10B, a display of gridding with the present invention applied to model both Type 1 and Type 2 internal boundaries. The grid near fault lines 444a and 444b honor the fault geometry. The grids near well groups 446a and 446b honor both the Type 1 and Type 2 boundaries. FIG. 10B clearly shows that the unconstrained Voronoi gridding method achieves an optimal solution to conform to all the internal boundaries (both Type 1 and Type 2) and the desirable grid sizes and spacing as per the targeted reservoir simulation requirements.

Figure 11A:
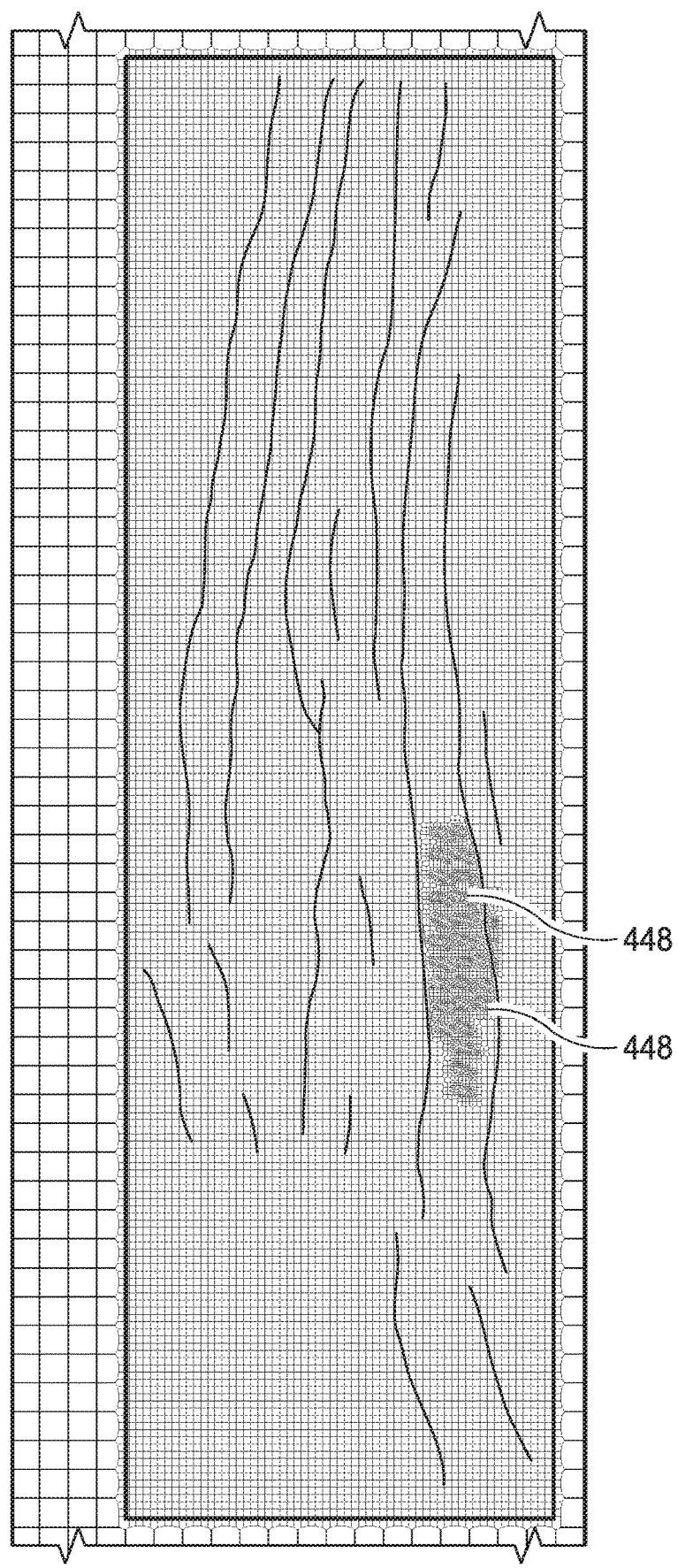
FIGS. 11A and 11B are enlarged views of portions of FIGS. 10A and 10B, respectively.
Figure 11B:
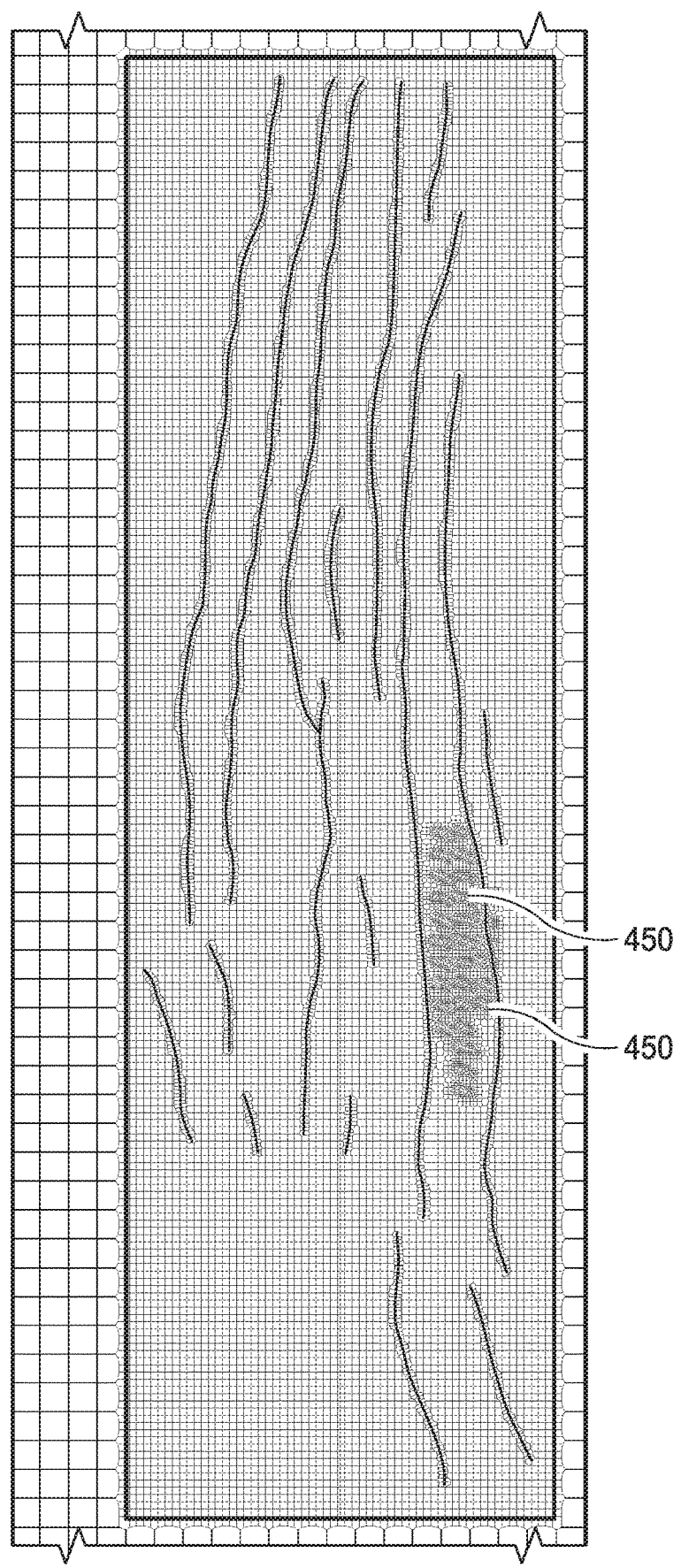
Figure 12A:
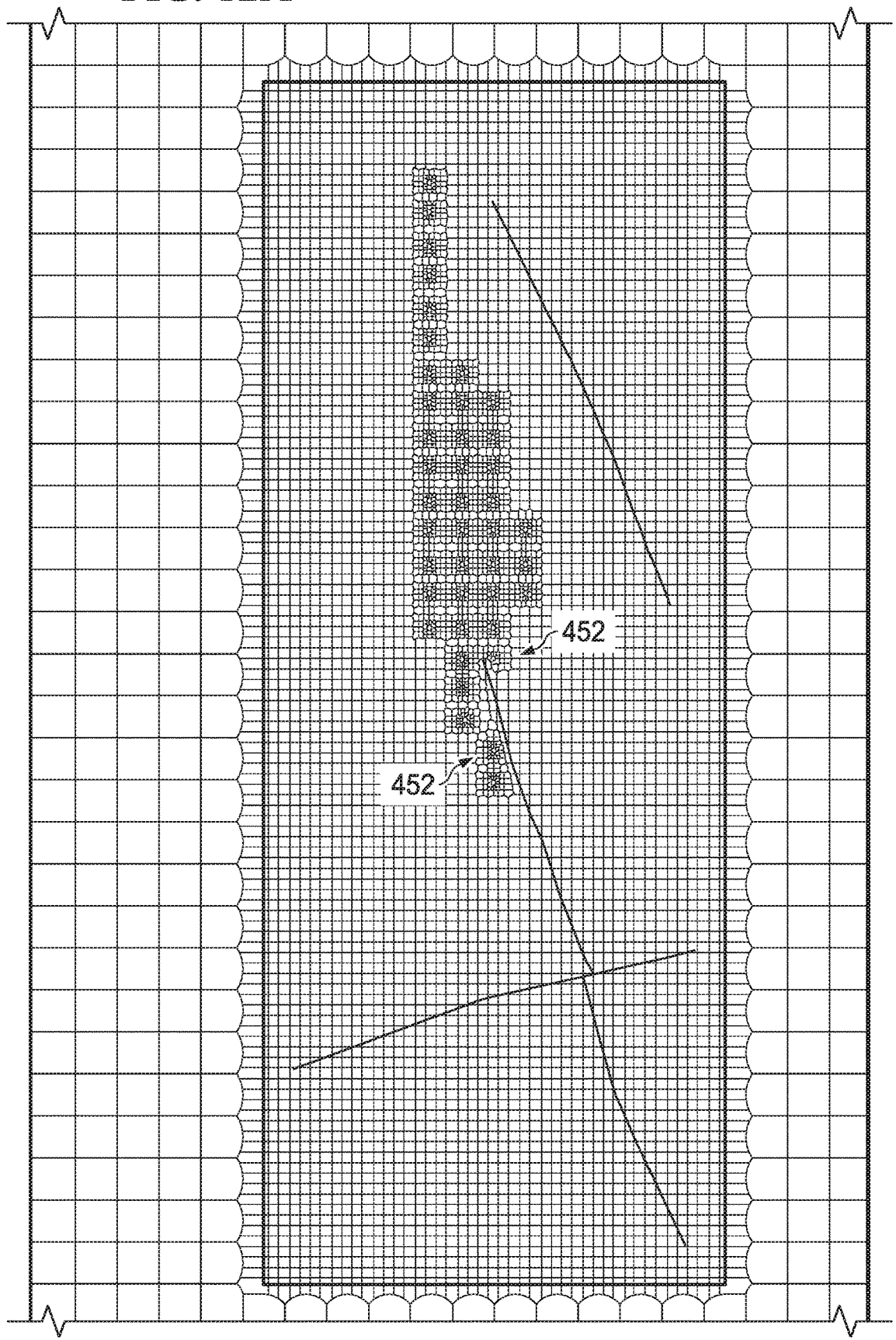
FIGS. 12A and 12B are enlarged views of other portions of FIGS. 10A and 10B, respectively.
Figure 12B:
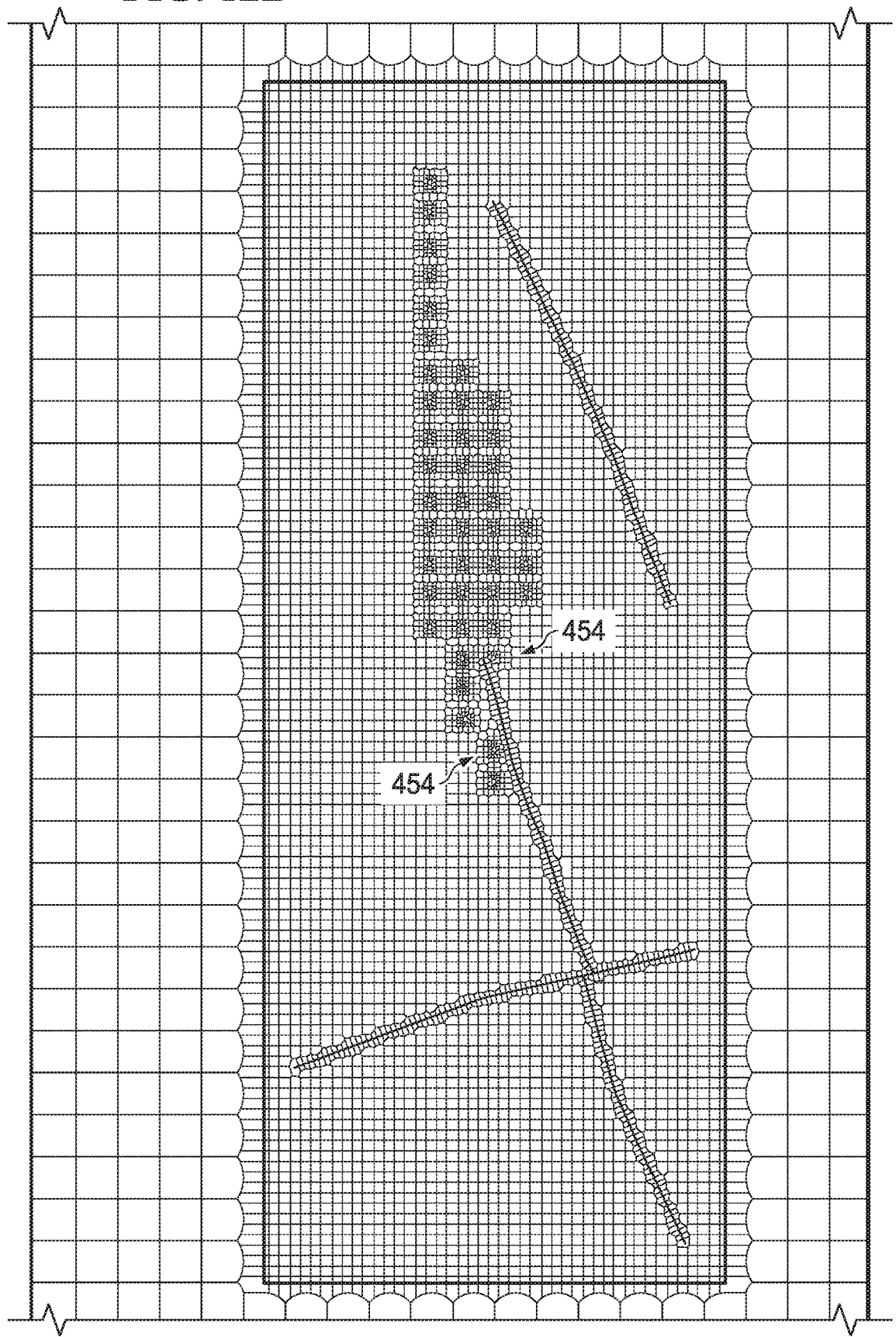

FIGS. 11A and 11B are enlarged views of the reservoir model gridding of FIG. 10A for a first of the two reservoirs under study. The grid locations 448 in FIG. 11A clearly show that Type 2 boundary is not honored and the grid location 450 in FIG. 11B clearly show that both types of boundaries are honored. FIGS. 12A and 12B are enlarged views of the reservoir model gridding of FIG. 10B for the second of the two reservoirs under study. The grid locations 452 in FIG. 12A clearly show that Type 2 boundary is not honored and the grid location 454 in FIG. 12B clearly show that both types of boundaries are honored.

Figure 13:
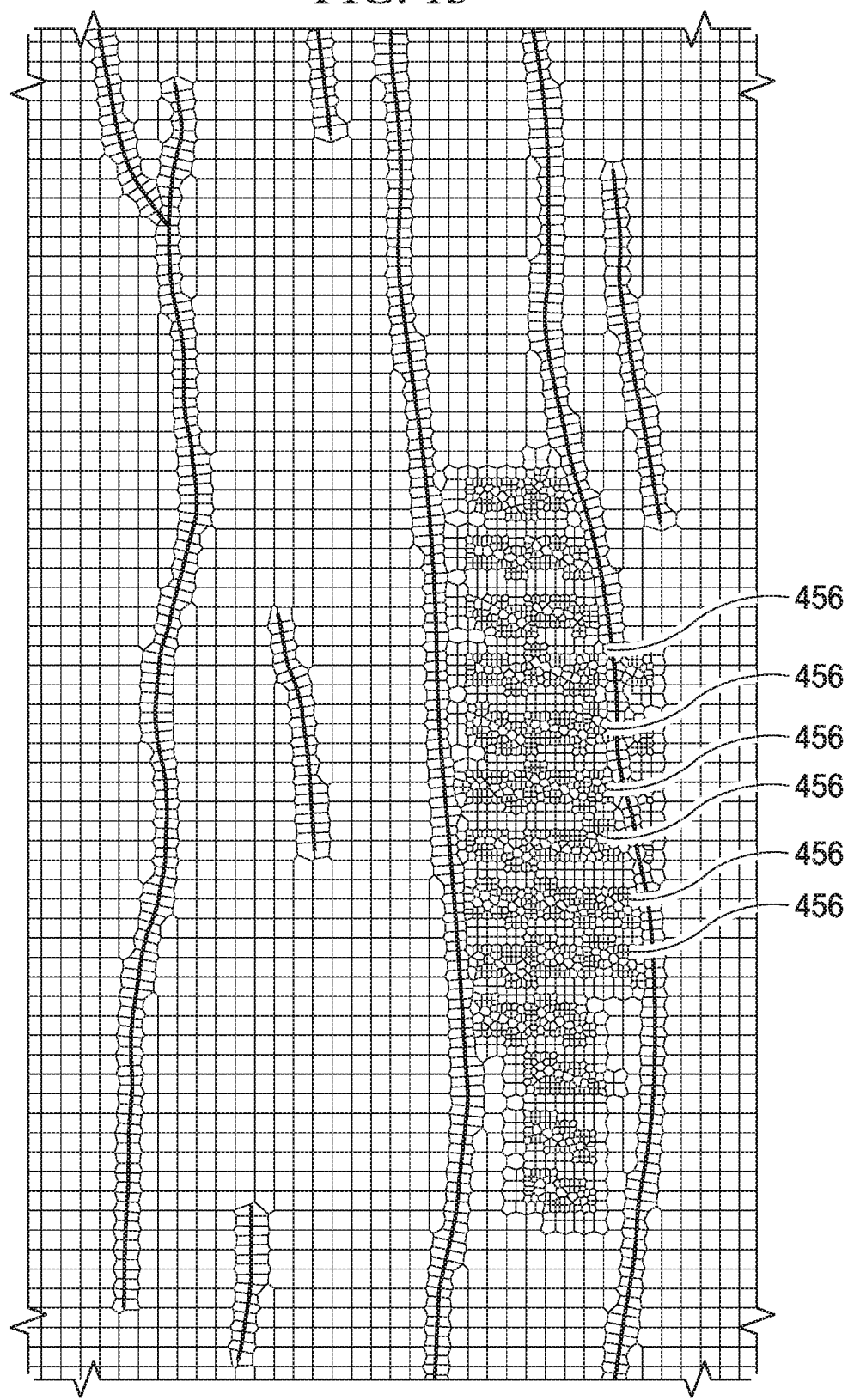
FIG. 13 is an enlarged view of a portion of FIG. 11B.
Figure 14:
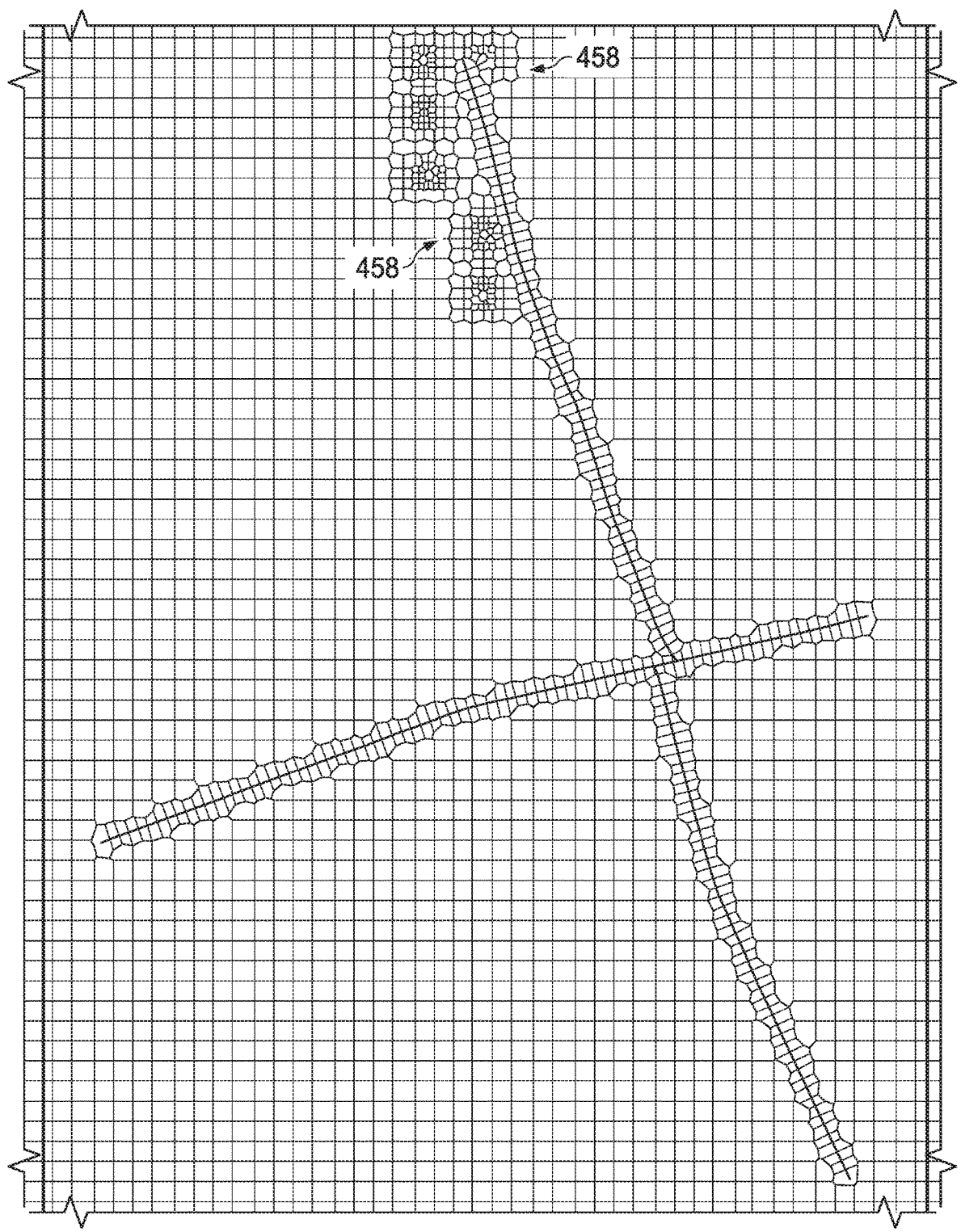
FIG. 14 is an enlarged view of a portion of FIG. 12B.

FIG. 13 is a further enlarged view of FIG. 11B and FIG. 14 is a further enlarged view of FIG. 12B. FIGS. 13 and 14 show more details of the areas 456 and 458 where Type 1 and Type 2 boundaries are overlapping, or congested, in some areas and how the present invention can optimally place good quality Voronoi cells in the vicinity of grid conflicts.

Figure 15:
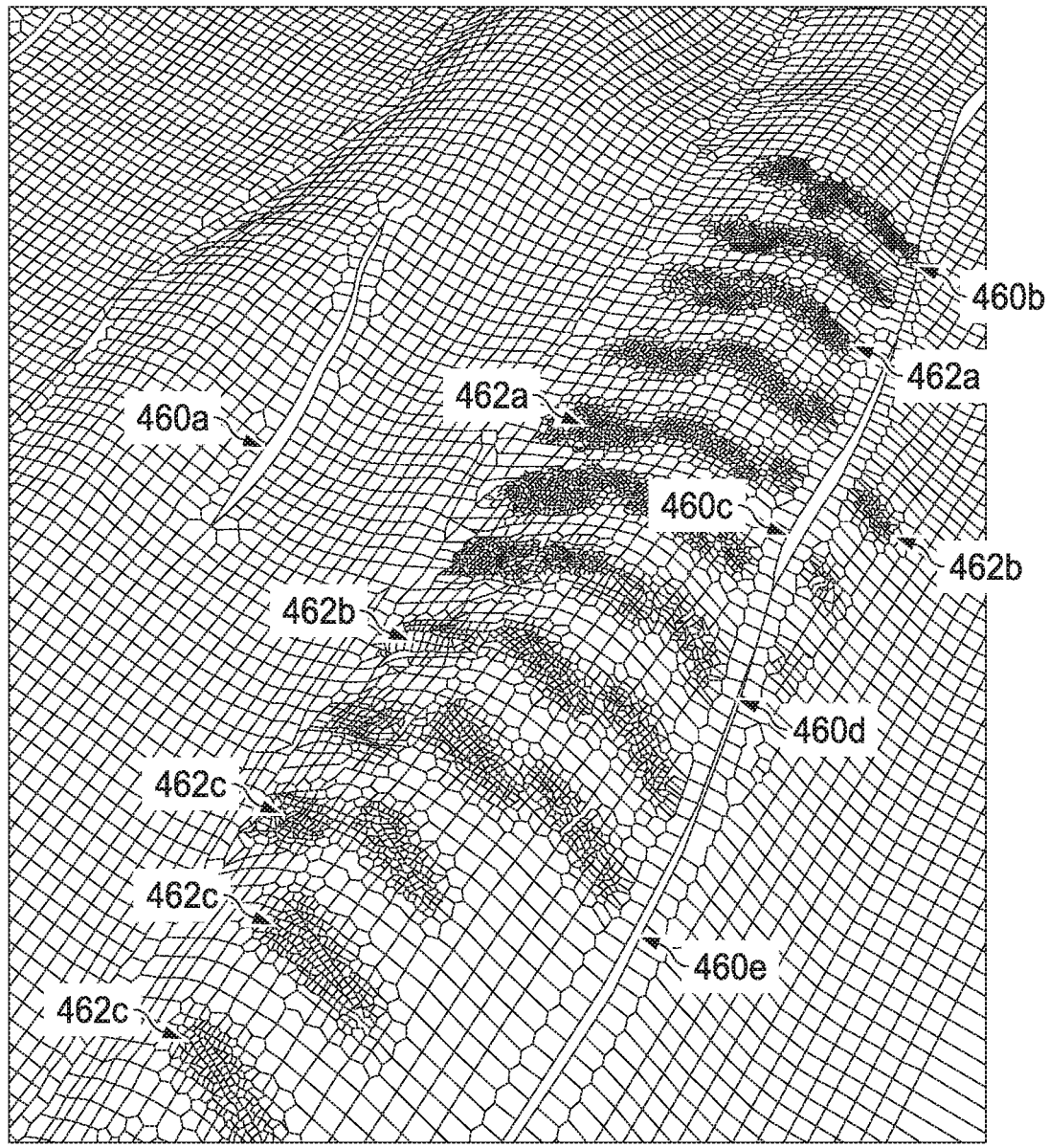
FIG. 15 is a display of gas saturation in a layer of the reservoir at one time step during dynamic reservoir simulation with a reservoir grid model formed according to the present invention.
Figure 16:
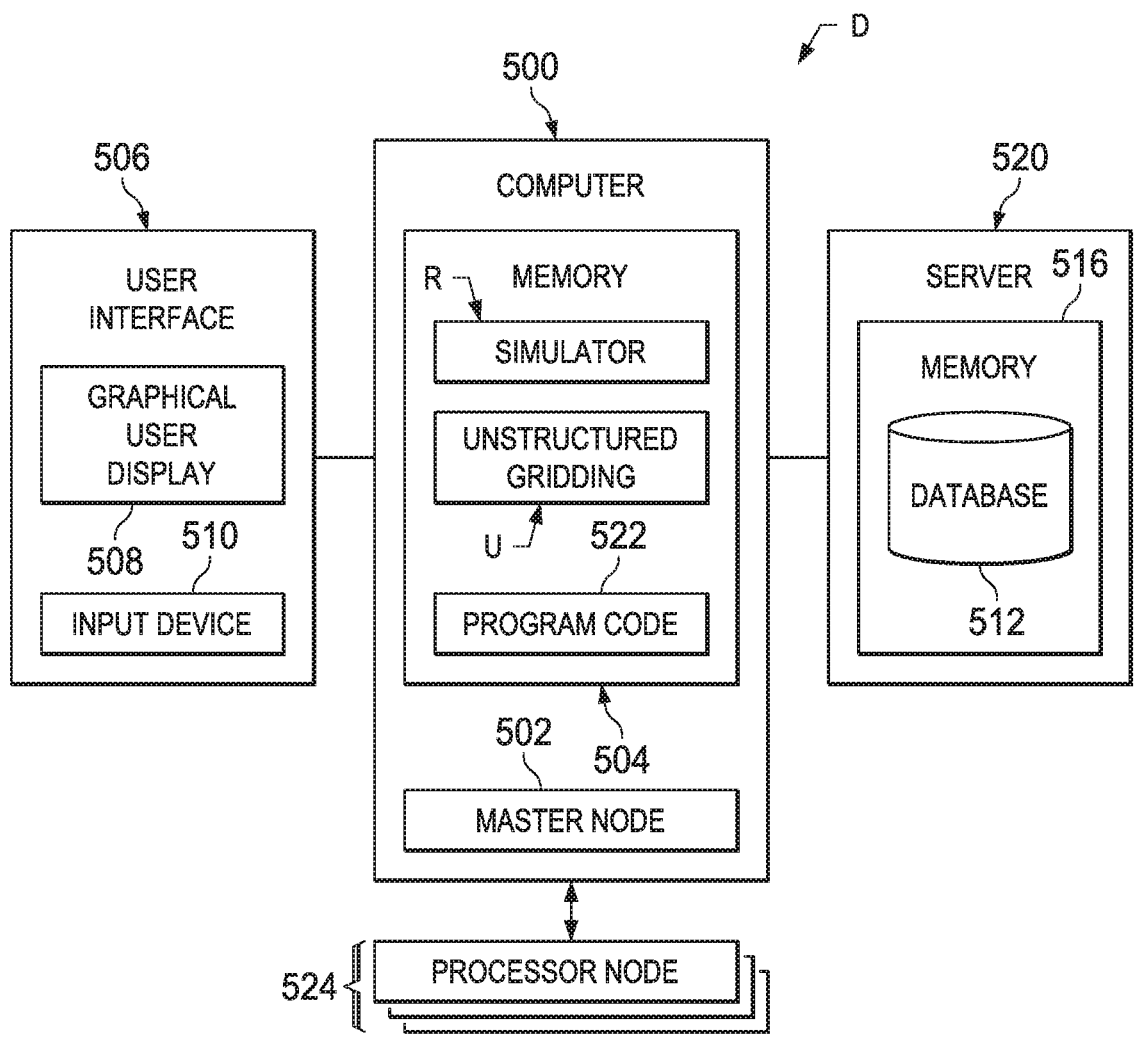
FIG. 16 is a schematic diagram of a computer network for modeling intersecting faults and complex wellbores in reservoir simulation according to the present invention.

Parallel reservoir simulation using Applicant's Giga-POWERS simulator has been carried out for the generated unstructured-grid model. FIG. 15 shows gas saturation in one layer of the reservoir at one time step. The Voronoi grid representation around the specified internal geometries is also clearly visible at fault line locations 460a-e and well trajectory locations 462a-c. In this model, because the faults are sealing, fluids cannot flow across the fault surface as the reservoir is being drained by the wells. The significance of correctly representing the near-well flow in relation to these reservoir discontinuities such as the sealing faults for a more accurate performance prediction cannot be overemphasized Data Processing System As illustrated in FIG. 16, the data processing system D includes a computer 500 having a master node processor 502 and memory 504 coupled to the processor 502 to store operating instructions, control information and database records therein. The data processing system D is preferably a multicore processor with nodes such as those from Intel Corporation or Advanced Micro Devices (AMD), or an HPC Linux cluster computer. The data processing system D may also be a mainframe computer of any conventional type of suitable processing capacity such as those available from International Business Machines (IBM of Armonk, N.Y. or other source. The data processing system D may in cases also be a computer of any conventional type of suitable processing capacity, such as a personal computer, laptop computer, or any other suitable processing apparatus. It should thus be understood that a number of commercially available data processing systems and types of computers may be used for this purpose.

The processor 502 is accessible to operators or users through user interface 506 and is available for displaying output data or records of processing results obtained according to the present invention with an output graphic user display 504. The output display 504 includes components such as a printer and an output display screen capable of providing printed output information or visible displays in the form of graphs, data sheets, graphical images, data plots and the like as output records or images.

The user interface 506 of computer 500 also includes a suitable user input device or input/output control unit 80 to provide a user access to control or access information and database records and operate the computer 500. Data processing system D further includes a database 512 of data stored in computer memory, which may be internal memory 504, or an external, networked, or non-networked memory as indicated at 516 in an associated database server 520.

The data processing system D includes program code 522 stored in non-transitory memory 504 of the computer 500. The program code 522 according to the present invention is in the form of computer operable instructions causing the data processor 502 to perform modeling of intersecting faults and complex wellbores in reservoir simulation according to the present invention in the manner that has been set forth.

The computer memory 504 also contains stored computer operating instructions in the non-transitory form of unstructured gridding module U according to Applicant's prior co-pending U.S. Application, the Reservoir Simulator Module R, and also the data from data base 512 being manipulated and processed by the processor 502.

It should be noted that program code 522 may be in the form of microcode, programs, routines, or symbolic computer operable languages that provide a specific set of ordered operations that control the functioning of the data processing system D and direct its operation. The instructions of program code 522 may be stored in memory 504 of the data processing system D, or on computer diskette, magnetic tape, conventional hard disk drive, electronic read-only memory, optical storage device, or other appropriate data storage device having a computer usable non-transitory medium stored thereon. Program code 522 may also be contained on a data storage device such as server 90 as a non-transitory computer readable medium, as shown.

The data processing system D may be comprised of a single CPU, or a computer cluster as shown in FIG. 6, including computer memory and other hardware that makes it possible to manipulate data and obtain output data from input data. A cluster is a collection of computers, referred to as nodes, connected via a network. Usually a cluster has one or two head nodes or master nodes 502 that are used to synchronize the activities of the other nodes, referred to as processing nodes 524. The processing nodes 524 all execute the same computer program and work independently on different segments of the grid which represents the reservoir.

Accordingly, in modeling for reservoir simulation with the present invention, input data regarding the field, reservoirs, faults, wellbore details from multiple data sources and databases, the geological model, the simulation model, are assembled and provided as input data. Control parameters as specified by simulation engineers to control grid sizes in each zone and area, and the gridding options such as quad-tree refinement, are also provided as inputs.

The gridding method of the present invention which simultaneously honor multiple types of internal boundaries in the domain, as well as grid sizes and quality requirements for reservoir simulation is then applied. The generated grid information, wellbore perforation information, fault description and interpolated property data are written to disk memory as model data files.

The model data files stored on disk memory are input files for parallel unstructured-grid reservoir simulation. Then, during parallel reservoir simulation, multiple compute processes are used to solve the simulation problem, preferably in a cluster computer. Each process in a cluster does the computation of a partition of the domain, called a subdomain. The parallel graph generation method and transmissibility calculation method can be used to construct the inter-cell connectivity information for flow simulation.

The present invention expands the processing methodology of Applicant's co-pending U.S. patent application Ser. No. 14/171,815 by enhancing the unstructured near-well modeling capability to include complex internal boundaries, such as faults or other discontinuities, in the unstructured grid reservoir simulation framework. With the present invention, the unstructured gridding processing is enhanced to provide integrated grid modeling, with accurate modeling of multiple types of internal boundary modeling, which can include a combination of complex wellbores, faults, large fractures, or other types of discontinuities. The present invention avoids the need for complicated grid smoothing steps, and produces high-quality boundary conforming grids without the need of applying constrained criteria.

The conflicting point removal methodology of Applicant's co-pending U.S. patent application Ser. No. 14/171,815 is further improved to include internal boundary grid points. During the unconstrained Voronoi gridding, all the internal boundary grid points in the domain are assigned weighted values; this is followed by a point optimization procedure to remove the conflicting internal boundary grid points which are too close to each other. Higher priority is given to the internal boundary grid points which better satisfy the near internal boundary grid density requirement, so that both the grid density and internal boundary modeling requirement can be simultaneously satisfied. As a result, optimal spacing between internal boundary grid points is maintained and triangles with desired angles and shapes are generated which leads to better approximations for reservoir simulation.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined methodology, or in the performance and utilization thereof, requires the claimed matter in the following claims; such structures shall be covered within the scope of the invention.

It should be noted and understood that there can be improvements and modifications made of the present invention described in detail above without departing from the spirit or scope of the invention as set forth in the accompanying claims.

What is claimed is:

1. A computer implemented method of reservoir simulation of flow near internal boundaries in a model of a subsurface reservoir, the reservoir model being composed of an unstructured grid comprising a plurality of Voronoi grid cells comprising grid points and internal boundaries of the reservoir; the internal boundaries comprising at least one irregular internal boundary, and at least one wellbore trajectory: the reservoir simulation being based on input data defining internal boundary geometry and internal boundary descriptions of the reservoir; and further based on well trajectory and completion data for well bores in the reservoir; the reservoir simulation being performed by parallel reservoir simulation processing by a computer comprising: a reservoir simulator module, an unstructured gridding module, a memory, at least one master node and a plurality of processor nodes; the reservoir simulation method comprising the computer implemented steps of:
  (a) storing in the memory computer operable instructions causing the plurality of processor nodes to perform the parallel reservoir simulation under control of the reservoir simulator module;
  (b) storing in the memory computer operable instructions causing the plurality of processor nodes to generate the unstructured grid under control of the unstructured gridding module;
  (c) generating the unstructured grid in the plurality of processor nodes under control of the stored computer operable instructions by performing the steps of:
    (1) refining the internal boundary geometry data to produce first grid points to represent the internal boundary geometry for the grid;
    (2) building internal boundary lines connecting adjacent ones of the grid points to form internal boundary line segments;
    (3) constructing internal boundary intersected circles at the grid points;
    (4) generating additional grid points between intersections of internal boundary intersected circles of adjacent ones of the grid points;
    (5) prioritizing the generated additional grid points with priority values according to internal boundary grid density requirements;
    (6) generating well points in the reservoir model;
    (7) prioritizing the generated well points with priority values based on well location and well grid size;
    (8) prioritizing fault points of the generated additional grid points with higher priority to fault points of generated internal boundary points than to the generated well points:
    (9) resolving conflicting grid points according to the results of the step of prioritizing when the distance between the grid points is less than a required spacing;
    (10) performing unconstrained Delaunay triangulation on the resolved grid points,
    (11) forming a perpendicular bisection grid of the resolved grid points to form the Voronoi grid cells of the unstructured grid with grid point spacing satisfying grid density and internal boundary modeling requirements;
    (12) generating the unstructured grid of the Voronoi grid cells satisfying grid density and internal boundary modeling requirements to conform to the internal boundaries, including the at least one irregular internal boundary, and the at least one wellbore trajectory, of the reservoir;
    (13) forming the generated unstructured grid of the Voronoi grid cells as Voronoi cell column data sub-domains for the parallel reservoir simulation in the processor nodes;
    (14) receiving the Voronoi cell column data sub-domains extending in the reservoir for a Voronoi grid cell and its adjacent Voronoi grid cells;
    (15) determining the nature of connections between the Voronoi grid cell and its adjacent Voronoi grid cells; and
    (16) determining under control of the reservoir simulator module the flow between the Voronoi grid cell and its adjacent Voronoi grid cells.

2. The computer implemented method of claim 1, wherein the determined nature of the connection is vertical, and wherein the step of determining the flow comprises determining a facet area and transmissibility for the connections between the Voronoi grid cell and connected adjacent Voronoi grid cells.

3. The computer implemented method of claim 1, wherein the determined nature of the connection is lateral, and further including the step of determining whether the lateral connection is a faulted edge, and:
  (a) if so, determining if an overlap exists between the Voronoi grid cell and an adjacent Voronoi grid cell, and determining a facet area and transmissibility for the connection between the overlapped cells;
  (b) if not, determining a facet area and transmissibility for the connection between the Voronoi grid cell and the connected adjacent Voronoi grid cell.

4. The computer implemented method of claim 1, wherein the determined nature of the connection is collocated, and wherein the step of determining the flow comprises determining a shape factor and transmissibility for the collocated connection between the cells.

5. The computer implemented method of claim 1, further including the step of updating in memory the determined flow factor between the Voronoi grid cell and its adjacent Voronoi grid cells.

6. The computer implemented method of claim 1, further including the step of iteratively repeating the steps of receiving the Voronoi cell column data sub-domains, determining the nature of connections, and determining under control of the reservoir simulator module the flow for each of the Voronoi grid cells of the reservoir model.

7. The computer implemented method of claim 1, wherein the computer is a computer cluster composed of a plurality of processing nodes, and further including the step of partitioning the Voronoi grid cells of the reservoir grid for assignment equally among the plurality of processing nodes.

8. The computer implemented method of claim 7, wherein the plurality of processing nodes perform the steps of receiving Voronoi cell column data sub-domains, determining the nature of connections, and determining under control of the reservoir simulator module the flow for the partitioned Voronoi grid cells of the reservoir grid.

9. The computer implemented method of claim 7, further including the steps of: (a) receiving in the processing nodes the partitioned Voronoi grid cells, and (b) iteratively repeating the processing steps of (i) determining the nature of connections, and (ii) determining under control of the reservoir simulator module the flow and for each of the connections between the partitioned Voronoi grid cells of the reservoir grid.

10. The computer implemented method of claim 1, further including the steps of: (a) receiving Voronoi cell column data sub-domains belonging to a grid partition, and (b) iteratively repeating the processing steps of: (i) determining the nature of connections, and (ii) determining under control of the reservoir simulator module the flow for each of connections of the received Voronoi cell column data sub-domains belonging to the grid partition.

11. A data processing system for reservoir simulation of flow near internal boundaries in a model of a subsurface reservoir; the reservoir model being composed of an unstructured grid comprising a plurality of Voronoi grid cells comprising grid points and internal boundaries of the reservoir; the internal boundaries comprising at least one irregular internal boundary, and at least one wellbore trajectory; the reservoir simulation being based on input data defining internal boundary geometry and internal boundary descriptions of the reservoir; and further based on well trajectory and completion data for well bores in the reservoir; the data processing system comprising:
(a) a reservoir simulator module;
(b) an unstructured gridding module;
(c) a memory storing computer operable instructions causing the reservoir simulation of flow by the reservoir simulator module;
(d) the memory further storing computer operable instructions causing the generation of the unstructured grid by the unstructured gridding module;
(e) a plurality of processor nodes operating in parallel and under control of the stored computer operable instructions generating the unstructured grid by performing the steps of:
    (1) refining the internal boundary geometry data to produce first grid points to represent the internal boundary geometry for the grid;
    (2) building internal boundary lines connecting adjacent ones of the grid points to form internal boundary line segments;
    (3) constructing internal boundary intersected circles at the grid points;
    (4) generating additional grid points between intersections of internal boundary intersected circles of adjacent ones of the grid points;
    (5) prioritizing the generated additional grid points with priority values according to internal boundary grid density requirements:
    (6) generating well points in the reservoir model;
    (7) prioritizing the generated well points with priority values based on well location and well grid size;
    (8) prioritizing fault points of the generated additional grid points with higher priority to fault points of generated internal boundary points than to the generated well points;
    (9) resolving conflicting grid points according to the results of the step of prioritizing when the distance between the grid points is less than a required spacing,
    (10) performing unconstrained Delaunay triangulation on the resolved grid points,
    (11) forming a perpendicular bisection grid of the resolved grid points to form the Voronoi grid cells of the unstructured grid with grid point spacing satisfying grid density and internal boundary modeling requirements;
    (12) generating the unstructured grid of the Voronoi grid cells satisfying grid density and internal boundary modeling requirements to conform to the internal boundaries, including the at least one irregular internal boundary, and the at least one wellbore trajectory, of the reservoir;
    (13) forming the generated unstructured grid of the Voronoi grid cells as Voronoi cell column data sub-domains for the parallel reservoir simulation in the processor nodes; and
    (14) receiving the Voronoi cell column data sub-domains extending in the reservoir for a Voronoi grid cell and its adjacent Voronoi grid cells;
    (15) determining the nature of connections between the Voronoi grid cell and adjacent Voronoi grid cells;
    (16) determining under control of the reservoir simulator module the flow between the Voronoi grid cell and its adjacent Voronoi grid cells; and
(f) a master node operating under control of the stored computer operable instructions and synchronizing the plurality of processor nodes in generation of the unstructured grid and in performing the reservoir simulation under control of the reservoir simulator module.

12. The data processing system of claim 11, wherein the determined nature of the connection is vertical, and wherein the processor in determining the flow determines a facet area and transmissibility for the connections between the Voronoi grid cell and connected adjacent Voronoi grid cells.

13. The data processing system of claim 11, wherein the determined nature of the connection is lateral, and wherein the processor determines whether the lateral connection is a faulted edge, and:
(a) if so, determines if an overlap exists between the Voronoi grid cell and an adjacent Voronoi grid cell, and determines a facet area and transmissibility for the connection between the overlapped cells; and (b) if not, determines a facet area and transmissibility for the connection between the Voronoi grid cell and connected adjacent Voronoi add cells.

14. The data processing system of claim 11, wherein the determined nature of the connection is collocated, and wherein the processor determines a shape factor and transmissibility for the collocated connection between the cells.

15. The data processing system of claim 11, further including a data memory, and wherein the processor updates in the memory the determined flow factor between the Voronoi grid cell and its adjacent Voronoi grid cells.

16. The data processing system of claim 11, further including the processor iteratively repeating the steps of receiving Voronoi cell column data sub-domains, determining the nature of connections, and determining the flow and for each of the Voronoi grid cells of the reservoir model.

17. The data processing system of claim 11, wherein the data processing system is a computer cluster comprising a master node and a plurality of processing nodes, and further including the master node partitioning the Voronoi grid cells of the reservoir grid for assignment equally among the plurality of processing nodes.

18. The data processing system of claim 17, wherein the plurality of processing nodes perform the steps of receiving Voronoi cell column data, determining the nature of connections, and determining the flow for the assigned grid cells of the reservoir model.

19. The data processing system of claim 18, further including the processing nodes: (a) receiving the partitioned Voronoi cell column data of the reservoir model; and (b) iteratively repeating the steps of (i) determining the nature of connections, and (ii) determining under control of the reservoir simulator module the flow for each of the connections between the partitioned grid cells of the reservoir model.

20. The data processing system of claim 11, further including the processor receiving its own grid partition of Voronoi cell column data, iteratively repeating the steps of determining the nature of connections, and (ii) determining the flow for each of connections between the grid cells of the grid partition.

21. A data storage device having stored in a non-transitory computer readable medium computer operable instructions for causing a data processing system to perform reservoir simulation of flow near internal boundaries of a subsurface reservoir, the reservoir model being composed of an unstructured grid comprising a plurality of Voronoi grid cells comprising grid points and internal boundaries of the reservoir; the internal boundaries comprising at least one irregular internal boundary, and at least one wellbore trajectory; the reservoir simulation being based on input data defining internal boundary geometry and internal boundary descriptions of the reservoir; and further based on well trajectory and completion data for well bores in the reservoir: the reservoir simulation being performed by parallel reservoir simulation processing by a computer comprising: a reservoir simulator module, an unstructured gridding module, a memory, at least one master node and a plurality of processor nodes; the instructions stored in the data storage device causing the data processing system to perform the following steps:
(a) storing in the memory computer operable instructions causing the plurality of processor nodes to perform the parallel reservoir simulation under control of the reservoir simulator module;
(b) storing in the memory computer operable instructions causing the plurality of processor nodes to generate the unstructured grid under control of the unstructured gridding module;
(c) generating the unstructured grid in the plurality of processor nodes under control of the stored computer operable instructions by performing the steps of:
(1) refining the internal boundary geometry data to produce first grid points to represent the internal boundary geometry for the grid;
(2) building internal boundary lines connecting adjacent ones of the grid points to form internal boundary line segments;
(3) constructing internal boundary intersected circles at the grid points;
(4) generating additional grid points between intersections of internal boundary intersected circles of adjacent ones of the grid points;
(5) prioritizing the generated additional grid points with priority values according to internal boundary grid density requirements;
(6) generating well points in the reservoir model;
(7) prioritizing the generated well points with priority values based on well location and well grid size;
(8) prioritizing fault points of the generated additional grid points with higher priority to fault points of generated internal boundary points than to the generated well points;
(9) resolving conflicting grid points according to the results of the step of prioritizing when the distance between the grid points is less than a required spacing,
(10) performing unconstrained Delaunay triangulation on the resolved grid points;
(11) forming a perpendicular bisection grid of the resolved grid points to form the Voronoi grid cells of the unstructured grid with grid point spacing satisfying grid density and internal boundary modeling requirements,
(12) generating the unstructured grid of the Voronoi grid cells satisfying grid density and internal boundary modeling requirements to conform to the internal boundaries, including the at least one irregular internal boundary, and the at least one wellbore trajectory, of the reservoir;
(13) forming the generated unstructured grid of the Voronoi grid cells as Voronoi cell column data sub-domains for the parallel reservoir simulation in the processor nodes;
(14) receiving the Voronoi cell column data sub-domains extending in the reservoir for a Voronoi grid cell and its adjacent Voronoi grid cells;
(15) determining the nature of connections between the Voronoi grid cell and its adjacent Voronoi grid cells; and
(16) determining under control of the reservoir simulator module the flow between the Voronoi grid cell and its adjacent Voronoi grid cells.

22. The data storage device of claim 21, wherein the determined nature of the connection is vertical, and wherein the instructions for performing the step of determining the flow comprise instructions to perform the step of determining a facet area and transmissibility for the connections between the Voronoi grid cell and its adjacent Voronoi grid cells.

23. The data storage device of claim 21, wherein the determined nature of the connection is lateral, and further including instructions to perform the step of determining whether the lateral connection is a faulted edge, and:
(a) if so, determining if an overlap exists between the Voronoi grid cell and an adjacent Voronoi grid cell, and determining a facet area and transmissibility for the connection between the overlapped cells;
(b) if not, determining a facet area and transmissibility for the connection between the Voronoi grid cell and the connected adjacent Voronoi grid cells.

24. The data storage device of claim 21, wherein the determined nature of the connection is collocated, and wherein the instructions for performing step of determining the flow comprises instructions to perform the step of determining a shape factor and transmissibility for the collocated connection between the cells.

25. The data storage device of claim 21, further including instructions to perform the step the step of updating in memory the determined flow factor between the Voronoi grid cell and its adjacent Voronoi grid cells.

26. The data storage device of claim 21, further including instructions to perform the step of (a) receiving the partitioned Voronoi cell column data sub-domains, and (b) iteratively repeating the steps of (i) determining the nature of connections, and (2) determining under control of the reservoir simulator module the flow for each of the grid cells of the reservoir model.

27. The data storage device of claim 21, wherein the computer is a computer cluster composed of a plurality of processing nodes, and further including instructions to perform the step of partitioning the Voronoi cells of the reservoir grid for assignment equally among the plurality of processing nodes.

28. The data storage device of claim 27, wherein the instructions cause the plurality of processing nodes to perform the steps of receiving Voronoi cell column data sub-domains, determining the nature of connections, and determining under control of the reservoir simulator module the flow for the partitioned grid cells of the reservoir model.

29. The data storage device of claim 28, wherein the instructions cause the plurality of processing nodes to perform the steps of (a) receiving the Voronoi cell column data sub-domains, and (b) iteratively repeat the steps of (i) determining the nature of connections, and (ii) determining under control of the reservoir simulator module the flow for each of the connections between the partitioned grid cells of the reservoir model.

30. The data storage device of claim 21, further including instructions causing the processor nodes to perform the steps of receiving the partitioned Voronoi cell column data sub-domains, and (b) iteratively repeating the steps of (i) determining the nature of connections, and (ii) determining the flow for each of connections between the grid cells of the reservoir model.

* * * * *

UNITED STATES PATENT AND TRADEMARK OFFICE
CERTIFICATE OF CORRECTION

PATENT NO. : 11,352,855 B2
APPLICATION NO. : 16/824989
DATED : June 7, 2022
INVENTOR(S) : Fung et al.

It is certified that error appears in the above-identified patent and that said Letters Patent is hereby corrected as shown below:

In the Claims

In Column 17, Claim 9, Line 30 should read:
-- reservoir simulator module the flow for each of the --

In Column 19, Claim 13, Line 3 should read:
-- connected adjacent Voronoi grid cells --

In Column 19, Claim 16, Line 15 should read:
-- determining the nature of connections, and determining the flow --

Signed and Sealed this
Thirtieth Day of August, 2022

Katherine Kelly Vidal
*Director of the United States Patent and Trademark Office*